United States Patent [19]

Mead et al.

[11] Patent Number: 4,745,579

[45] Date of Patent: May 17, 1988

[54] ELECTRICALLY ERASABLE PROGRAMMABLE LOGIC ARRAY (EEPLA)

[75] Inventors: Carver Mead, Pasadena; Cecilia Shen, Palo Alto, both of Calif.

[73] Assignee: Silicon Communications Corporation, Menlo Park, Calif.

[21] Appl. No.: 837,388

[22] PCT Filed: Feb. 7, 1986

[86] PCT No.: PCT/US86/00286

§ 371 Date: Feb. 7, 1986

§ 102(e) Date: Feb. 7, 1986

[87] PCT Pub. No.: WO87/04879

PCT Pub. Date: Aug. 13, 1987

[51] Int. Cl.[4] ............... G11C 17/00; H03K 19/177
[52] U.S. Cl. ........................ 365/104; 364/716; 307/465
[58] Field of Search ........... 340/825.83, 825.91; 364/716; 307/465; 365/185, 189, 104, 174

[56] References Cited

U.S. PATENT DOCUMENTS

| | | | |
|---|---|---|---|
| 4,064,494 | 12/1977 | Dickson et al. | 365/49 |
| 4,068,305 | 1/1978 | Cutler | 364/200 |
| 4,313,106 | 1/1982 | Hsu | 340/825.91 |
| 4,490,812 | 12/1984 | Guterman | 307/465 X |

Primary Examiner—Joseph A. Popek
Attorney, Agent, or Firm—Irwin Ostroff

[57] ABSTRACT

An Electrically Erasable Programmable Logic Array (EEPLAS) (10,000) has an AND plasma (10,002) having a first array (10) of devices (Md11 through MDMN) each containing nonvolatile upper and lower memory cells that each have two serially connected field effect transistors (STUC, MTUC and STLC,MTLC), and an OR plane (10,004) having a second array (12,600) of memory cells with each cell being the same as the cells of the first array (10), and output inverting buffers (12,400). Bit lines (BLa1 through BLaN) of the first array (10) are coupled to word lines (WL1a through WLNa) of the second array (12,600). Each bit line (BLf1 through BLfx) of the second array (12,600) is connected to an input terminal of an inverting buffer (12,400). The outputs of the inverting buffers (12,400) serve as the Electrically Erasable Programmable Logic Array (10,000) output terminals. Each of the memory cells is an electrically erasable nonvolatile cell. This arrangement allows the EEPLAS (10,000) to be repeatedly reconfigured by an end user or by a run-time self adjusting reconfigurable control system. Various portions of EEPLAS (10,000) are illustrated in FIGS. 3, 4, and 9.

23 Claims, 14 Drawing Sheets

ELECTRICALLY ERASABLE PROGRAMMABLE LOGIC ARRAY (EEPLA)

FIELD OF INVENTION

This invention relates to systems which can be reconfigured and, in particular, to electrically erasable systems that can be repeatedly reconfigured.

BACKGROUND OF INVENTION

Associative memories and Programmable Logic Arrays (PLAs) are typically programmed by the manufacturer or are programmed in the field by electrically opening (blowing) fusible links to establish the memory stored or the logic functions desired. Known commercially available programmable Associative memories and programmable PLA's can be configured only once. The book entitled "Introduction to VSLI Systems" by Carver Mead (one of the present inventors) et al, pages 80–82, illustrates a programmable logic array having two arrays of memory cells with each memory cell being a single conventional field effect transistor. The presence or absence of a transistor in any location of either array is indicative of a "1" and "0", respectively, stored at that location. The presence or effective absence of a transistor at a particular memory location is either set by the manufacturer or is established by blowing fusible links either electrically or with a laser.

The publication entitled "High Performance MOS EPROMs Using a Stacked Gate Cell," International Solid State Circuits Conference Digest of Technical Papers, page 186, February 1977, describes nonvolatile devices which are erased by exposing them to ultraviolet light. The need to have a source of ultraviolet light and to package the devices such that they could easily be exposed to ultraviolet light, as well as poor reproducibility and fast wear out during program/erase cycling, limits the use of this device.

The publication entitled "A 16 Kb Electrically Erasable Nonvolatile Memory," International Solid State Circuits Conference Digest of Technical Papers, pages 152 and 153, describes a nonvolatile device, denoted as FLOTOX (floating gate tunnel oxide), which consists of two field effect transistors which are serially connected together with the source of the first connected to the drain of the second. The first transistor, which is denoted as a select transistor, is a conventional field effect transistor. The second transistor, which is denoted as a memory transistor, is a field effect transistor which has a floating gate structure in addition to a gate terminal to which control voltages are directly applied. The floating gate has a portion which is separated from a major surface of the semiconductor substrate by a thin silicon dioxide layer denoted as tunnel oxide. The FLOTOX cell, which is implemented using n-channel transistors, is both programmed and erased by applying appropriate potentials to the gate terminals of both transistors, to the drain terminal of the select transistor, and to the source terminal of the memory transistor. The FLOTOX cells are illustrated in a memory array having two rows of memory cells and two columns. The cell and the basic form of the array were used to form a 16K EEPROM.

It is desirable to incorporate EEPROM technology in associative memories and PLAs in order to allow same to be repeatedly reconfigured by an end user or by a run-time self adjusting reconfigurable control system.

SUMMARY OF INVENTION

The present invention relates to circuitry which can be used as part of an associative memory or a programmable logic array (PLA) which can both be repeatedly reconfigured by an end user or by a run-time self adjusting reconfigurable control system. In one embodiment the circuitry comprises a first array of rows and columns of devices with each device comprising electrically erasable upper and lower memory cells that each have a control terminal and an input/output terminal. First and second select lines of a separate pair of a plurality of select lines are coupled to the control terminals of the upper and lower memory cells, respectively, of the devices of a separate row of devices. A separate one of a plurality of bit lines is coupled to the upper and lower memory cells of the devices of a separate column of devices. Select line means is coupled to the select lines for selectively causing one of the select lines of one or more pairs of select lines to be coupled to a first potential level which facilitates a read out of information stored in the memory cells and for selectively causing the other select line of each pair of select lines to be coupled to a second potential level which inhibits read out of information from the memory cells. The select line means is adapted to selectively allow one select line of two or more select lines to be set to the first potential level during the same time period.

In another embodiment the circuitry comprises a first array of M rows and N columns of devices with each device comprising essentially identical upper and lower memory cells. Each memory cell is electrically erasable and programmable and comprises first and second field effect transistors with each having a gate terminal and first and second output terminals. The second transistor of each memory cell is adapted to store electrical charge which is indicative of information stored in that memory cell. A separate pair of M pairs of select lines are associated with each of the M rows of memory devices. A separate one of N control lines and a separate one of N bit lines are associated with each column of devices.

A first and a second select line of a separate pair of the M pairs of select lines are coupled to the gate terminal of each of the first transistors of the upper memory cells of a common row of devices and to the gate terminal of each of the first transistors of the lower memory cells of the same common row of devices, respectively. A separate one of the N control lines is coupled to the gate terminals of each of the second transistors of the upper and lower memory cells of all devices of a common column of devices. A separate one of the bit lines is coupled to the drain terminal of each of the first transistors of the upper and lower memory cells of all devices of a column of devices.

Preselected data comprising up to M×N bits ("1's" and/or "0's") is written into the upper memory cells with the complement of such data being written into the lower memory cells. Some devices receive "0's" in both the upper and lower memory cells. These devices are located in portions of the array which are denoted as "don't care" locations. Each memory cell acts essentially as an inverter circuit. If a "1" is applied to the gate terminal of the first transistor and a reference potential is applied to the gate terminal of the second transistor, the output of the cell is a "1" if the cell stores a "0", and is a "0" if the cell stores a "1". All of the memory cells of the devices of a common column act to pull the bit line associated with that column low (a "0") if any memory cell of a device of that column contains a stored "1" and that memory cell has a "1" applied to the gate terminal of the first transistor. Accordingly, each column of devices essentially performs a NOR function. The memory cells thus essentially act as inverters if the input signal on the gate of the first transistor is a "1".

In order to get a "1" output signal from a cell when a "1" is applied to the gate of the first transistor of the cell, the cell has to have had a "0" previously written in. This is the equivalent of having an inverter logic gate in series with the gate terminal of each first transistor. A NOR gate with an inverter gates in series with each input terminal is the equivalent of an AND gate. Accordingly, the circuitry essentially performs an AND logic function. The first array is denoted as an AND Plane. During a read (or "associate") operation, the logic value of each input bit is applied to the upper select line of the row associated with that bit, and the logical complement is applied to the lower select line of that row. If all of the inputs to the first transistors are the complement of the logic levels of the information stored in the memory cells of a column of devices, then the output of that column is a high (a "1") and there is said to be a match of the input data and the data stored in that column. If this condition is not met then the outputs of all columns of the circuitry are "0". This corresponds to there not being a complete match of the logic levels of the input signals with the information stored in any column. The circuitry therefore performs an Associative Memory function.

In any memory location where there are 0's written into both the upper and lower memory transistors, the memory cell cannot pull down the bit line associated therewith. Accordingly, such location matches either a "1" or a "0" for that bit of input data. This represents a "don't care" capability.

In still another embodiment of the present invention, which acts as a PLA, the circuitry further comprises a second array of memory cells arranged in N rows and X columns. Each of these memory cells is similar to the memory cells of the first array. A separate one of N word lines is coupled to the gate terminal of the first transistor of each memory cell of a common row of memory cells of the second array and a separate one of N control lines is coupled to the gate terminal of the second transistor of each memory cell of the same common row of memory cells of the second array. A separate one of X bit lines is coupled to the first output terminal of each first transistor of a common row of memory cells of the second array. An input terminal of a separate one of X inverter gates is coupled to each of the X bit lines with X output terminals of the X inverter circuits acting as the circuitry output terminals. The second array performs a logical NOR function. The series combination of the NOR function and the inversion provides a logical OR function. The second array and the inverter gates are denoted as an OR Plane. The bit lines of the first array are coupled to or also serve as the word lines of the second array. The bit lines of the first array can be considered as the outputs of the first array and the word lines of the second array can be considered the inputs of the second array. Accordingly, the outputs of the AND Plane are coupled to the inputs of the OR Plane. This circuitry thus provides the combination of AND and OR planes which forms a PLA.

In a preferred embodiment the PLA uses EEPROM memory cells of the type described in the publication entitled "A 16K Electrically Erasable Nonvolatile Memory" and discussed in the Background of the Invention hereinabove. This makes the PLA one which can be repeatedly reconfigured in the field by an end user.

In a further embodiment of the circuitry of the present invention, each memory cell comprises just one field effect transistor which is adapted to store electrical charge which is indicative of information stored in that memory cell. With this embodiment there is no need for control lines. Examples of memory cells which are useful as the memory cell of the present invention are described in the articles entitled "Low-power EEPROM can be reprogrammed fast" by E. K. Sketon, Electronics, July 31, 1980, pages 89-91 and "A SHIELDED SUBSTRATE INJECTOR MOS (SSIMOS) EEPROM CELL" by R. G. Stewart et al, Technical Digest, December, 1984, International Electron Devices Meeting.

These and other features and advantages of the invention will be better understood from consideration of the following detailed description taken in conjunction with the accompanying drawings.

DETAILED DESCRIPTION

Figure 1:
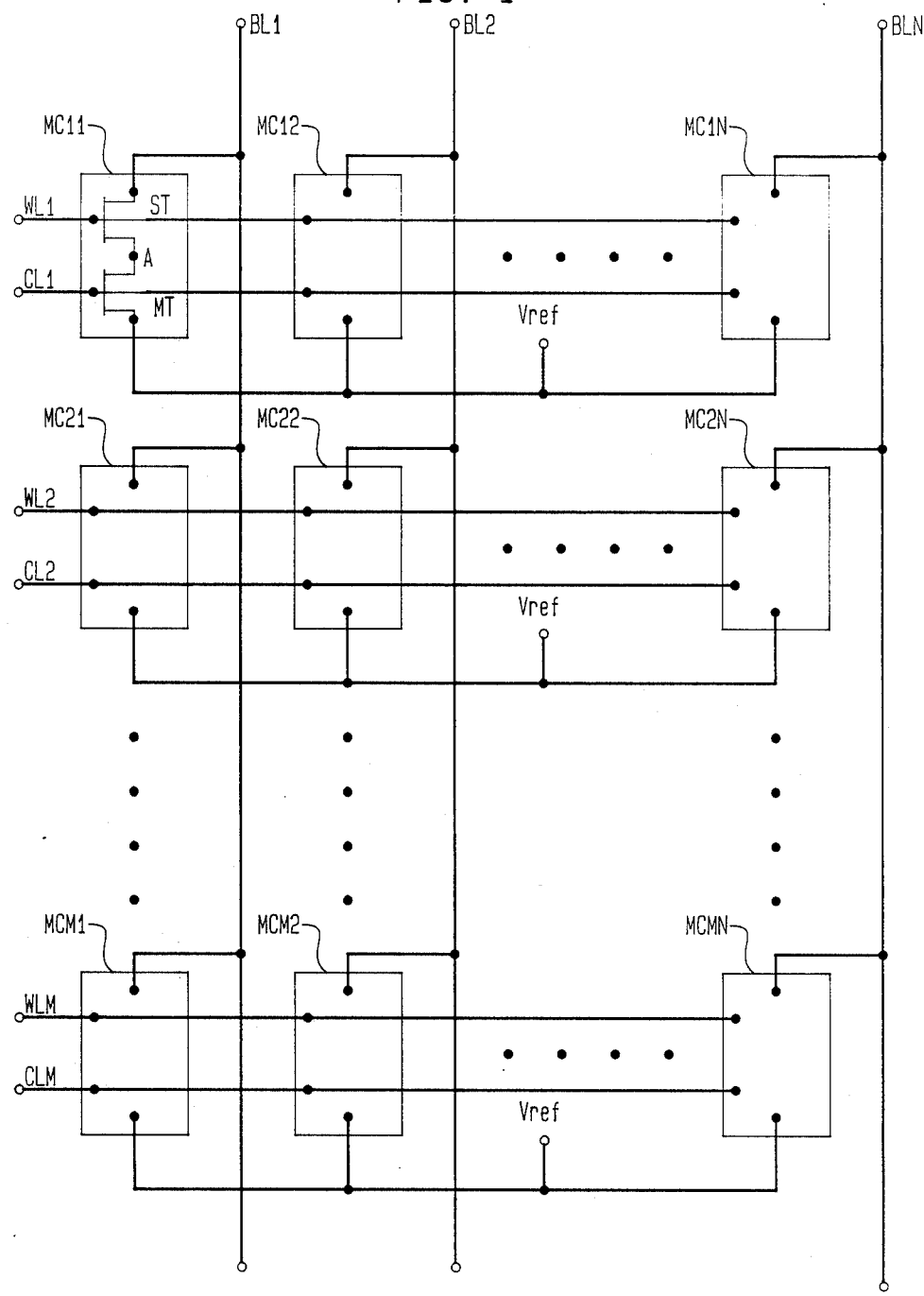
FIG. 1 illustrates a prior art array of EEPROM memory cells.

Referring now to FIG. 1, there is illustrated a prior art electrically erasable nonvolatile memory array of memory cells MC arranged in M rows and N columns, where M and N are positive integers. Each row of memory cells has a separate Word Line WL and a separate Control Line CL associated therewith. Each column of memory cells has a separate Bit Line BL associated therewith. Bit lines BL1, BL2, ... BLN are illustrated. There are a total of N Bit Lines, M Word Lines, and M Control Lines. The numbers following each MC denote the location of that memory cell in the array. Word lines WL1, WL2, ... WLM are illustrated as well control lines CL1, CL2, ... CLM. For example, memory cell MC22 is located in the second row and the second column.

Figure 7:
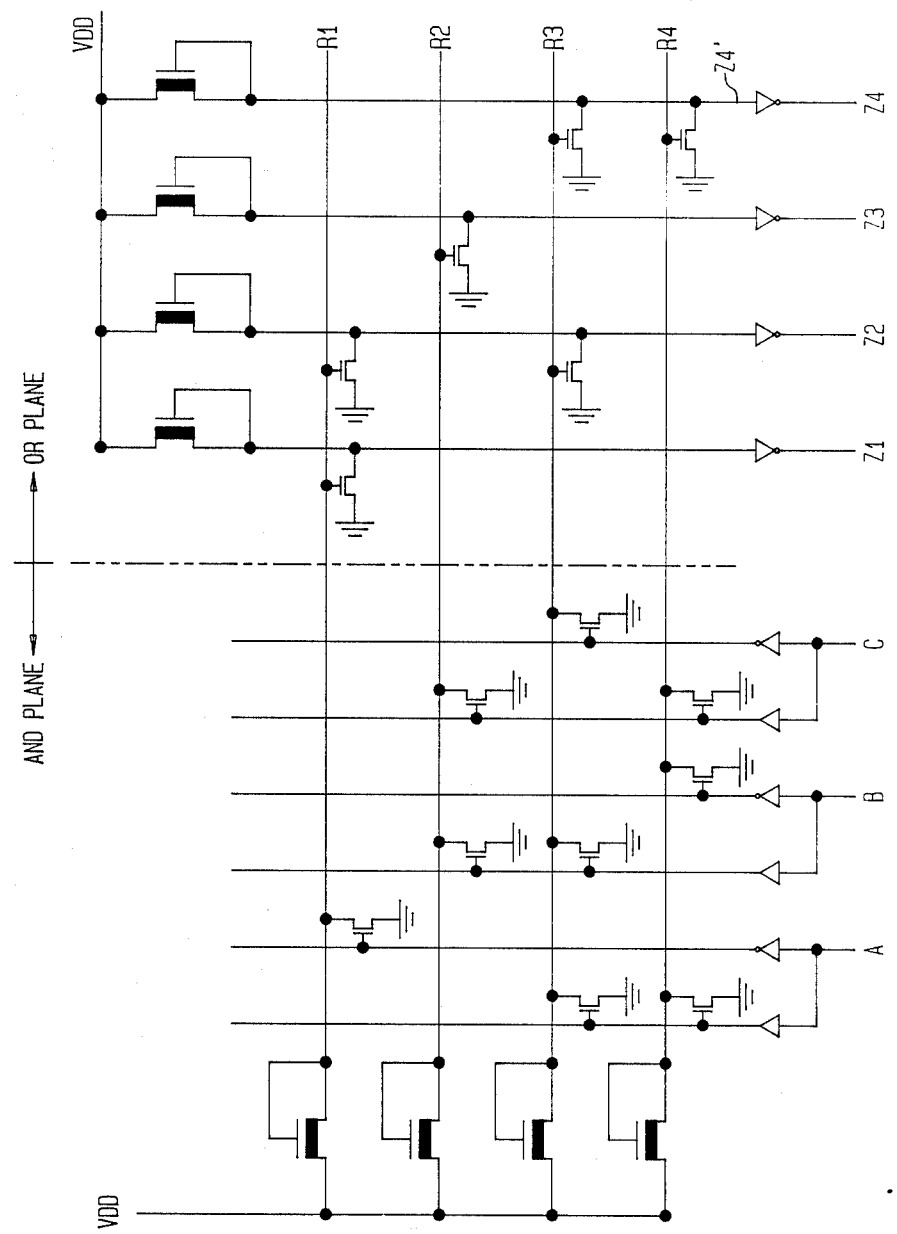
FIG. 7 illustrates a prior art programmable logic array.

Each of the memory cells consists of first (ST) and second (MT) field effect transistors with one output terminal of ST being connected to one output terminal of MT and to a terminal A. Both transistors are typically N-channel MOS transistors with the source of ST connected to the drain of MT. ST is typically a conventional MOS transistor and is denoted as a select transistor. The second transistor is an MOS transistor having a gate terminal and a second gate region which is separated from a major surface of the semiconductor substrate (or epi layer) (both not illustrated) on which it is fabricated by a thin layer of a dielectric such as nitrided silicon dioxide. This thin layer is denoted as tunnel oxide. This second gate region has no electrical terminal connected thereto and is denoted as a floating gate. Each WL is coupled to the gate terminals of the ST's of a separate row of MC's. For example, WL2 is coupled to the gate terminals of the ST's of MC21, MC22, ... MC2N. Each CL is coupled to the gate terminals of each MT of a separate row of MC's. For example, CLM is coupled to the gate terminals of the MT's of MCM1, MCM2, ... MCMN. Each of the bit lines is coupled through a pull-up element (not illustrated) to a voltage source (not illustrated). An example of bit lines of a memory array coupled through pull-up elements to a voltage source is illustrated in FIG. 7 herein. The pull-up elements illustrated in FIG. 7 are field effect transistors. Examples of typical embodiments of this type of memory cell array configuration are presented in the publications entitled "A 16 Kb Electrically Erasable Nonvolatile Memory" by William S. Johnson et al, 1980 International Solid-State Circuits Conference, February 1980, pages 152, 153, and "16K EE-PROM Relies on Tunneling for Byte-Erasable Program Storage" by William S. Johnson et al, Electronics, February 1980, pages 113–117.

Figure 2:
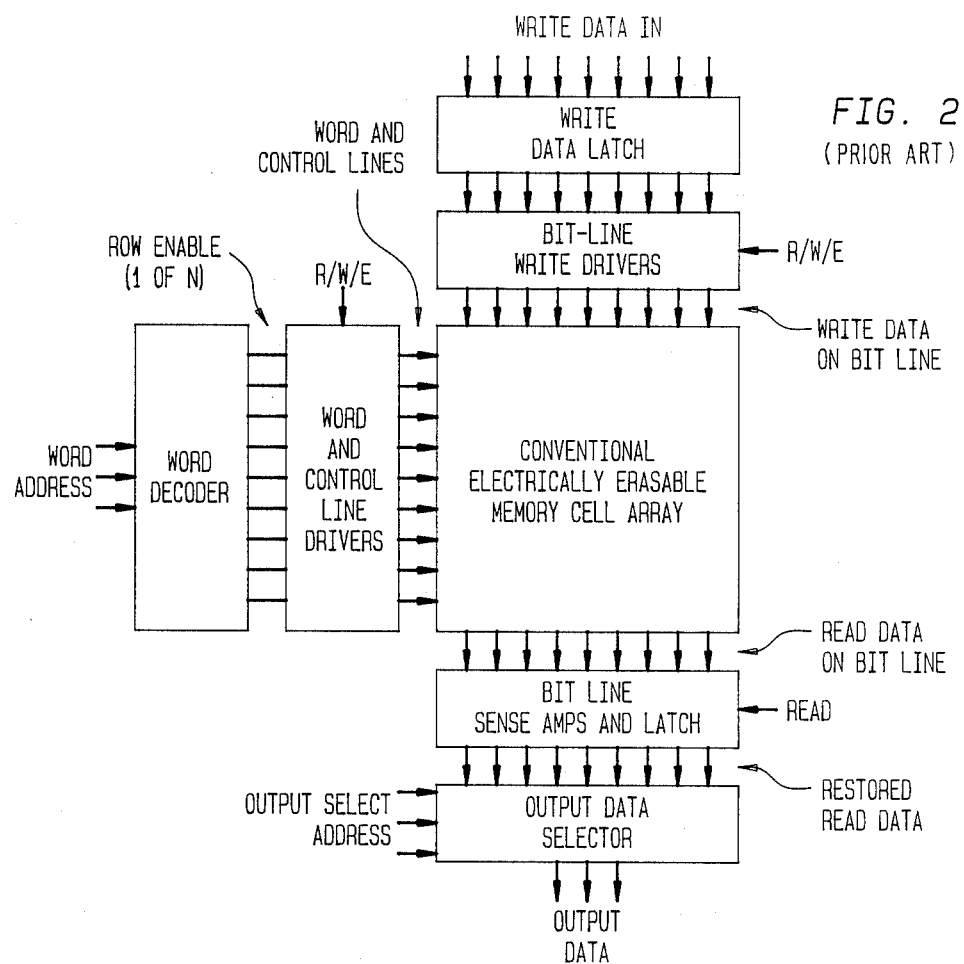
FIG. 2 illustrates a prior art EEPROM memory system which uses the array of FIG. 1.

Referring now to FIG. 2, there is illustrated a prior art electrically erasable programmable read only memory system EEPROMS which uses the array of FIG. 1. For a read operation, a row address is decoded by the word decoder and a single word line of the corresponding row is driven high by its word line driver. All other word lines remain low. All cells in the row are connected to their respective bit lines by virtue of the upper transistors, which are on since their gates are high. Any lower transistor which stores a "1" allows that cell to draw current from its bit line. Those transistors storing a "0" are open and draw no current (or a much smaller current) from their bit lines. The current drawn by the cells is sensed by inverting bit-line sense amplifiers. The outputs of the sense amplifiers are at the same logic levels as exist in the memory cells of the row. Usually there are more such bits than can be sent off chip, so a subset is selected by the output data selector based on the output select address.

To erase a row, the address of the row to be erased is decoded by the word decoder, and a high voltage Ve is placed on both control and word line for that row by the word and control line drivers. All bit lines are held low during this operation. Some memories allow all cells to be erased in one operation by raising all control and word lines high at the same time.

To write one or more bits into a particular row, the data to be written is loaded into the write data latch. The bit lines for bits where the write data is a logical "1" are driven to a high voltage Vw by the corresponding write drivers. Bit lines for bit positions where the write data is logical "0" are held low. The word line for the row into which data is to be written is driven to Vw by its word line driver. All control lines are held low by their drivers. The memory cells of a column that has not previously been written can always be written at a later time. The memory array accumulates the logical OR of all write operations into each row since the last erase operation on that row. The write voltage Vw must usually be larger than the erase voltage Ve for the same cell since some voltage is lost across the upper transistor, which is used as a follower during the write operation. In many commercial memories, the write data latch is merged with the read latch, and the bit-line write drivers are merged with the sense amplifiers into bit-line electronics. This merging of functions often obscures the operation of the device, so they are presented here as separate physical structures.

Figure 3:
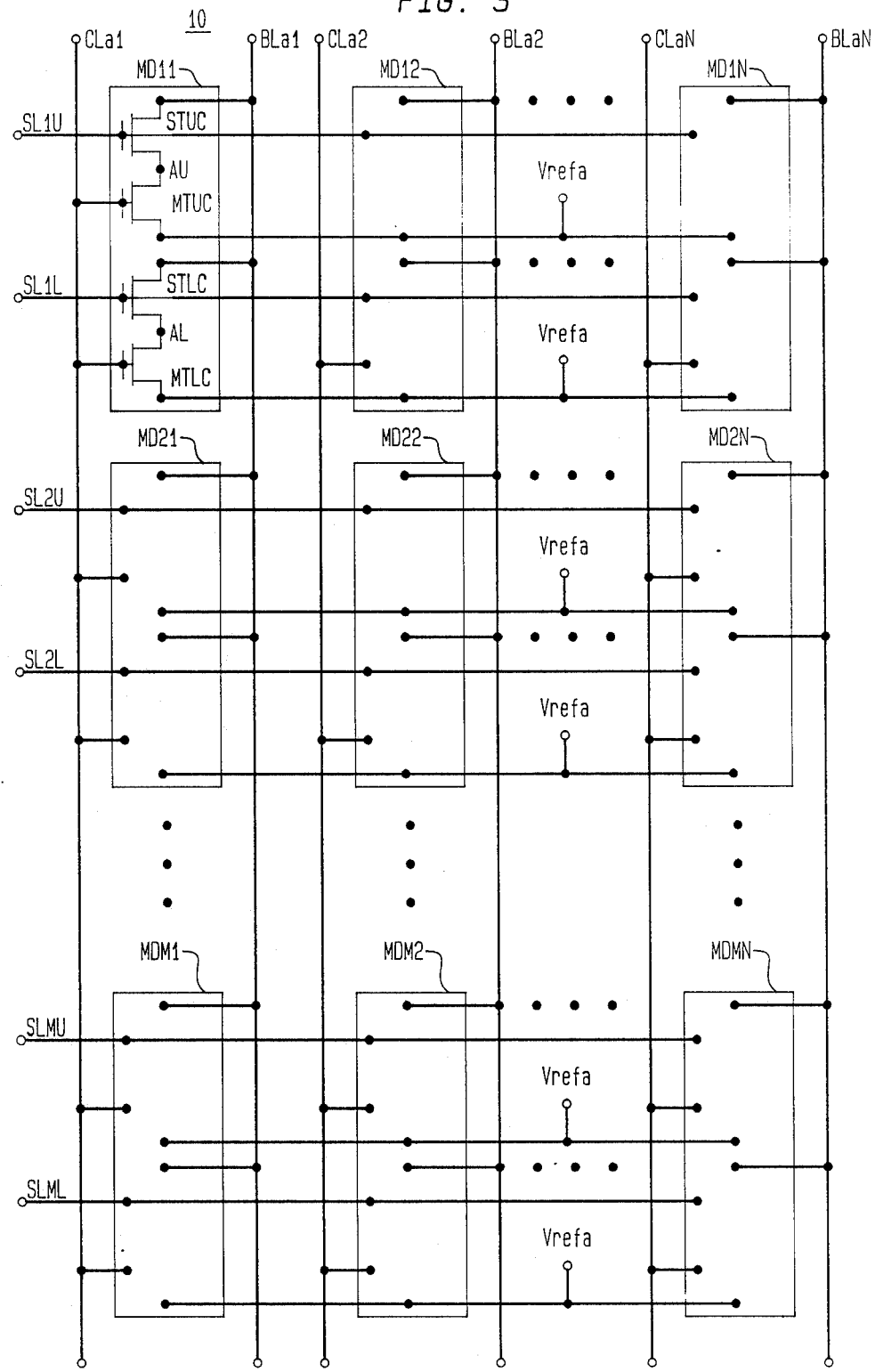
FIG. 3 illustrates an array of devices in accordance with the present invention.

Referring now to FIG. 3, there is illustrated a programmable and electrically erasable nonvolatile array 10 of memory devices MD arranged in M rows and N columns in accordance with the present invention. Array 10 may also be denoted as an electrically erasable associative two transistor memory cell array. M and N are positive integers. The numbers following each MD denote the location of that memory device in the array. For example, memory device MDM2 is in the Mth row and in the second column. Each MD comprises two separate memory cells (an upper cell and a lower cell) which are similar to the memory cells illustrated in FIG. 1 as MC11 through MCNM. The upper memory cell of an MD comprises a first transistor STUC (Select Transistor Upper Cell), and a second transistor MTUC (Memory Transistor Upper Cell). The lower memory cell of MD comprises a first transistor STLC, (Select Transistor Lower Cell), and a second transistor MTLC (Memory Transistor Lower Cell). The source terminal of STUC is coupled to the drain terminal of MTUC and to a terminal AU. The source terminal of STLC is coupled to the drain terminal of MTLC and to a terminal AL. Each MD is capable of storing two bits of information, one in the MTUC of the upper memory cell and a second bit in the MTLC of the lower memory cell.

The drain terminals of the two select transistors, STUC and STLC, of each memory device of a common column of MD's are coupled to a separate one of Bit Lines BLa1, BLa2, ... BLaN. For example, the drain terminals of select transistors of MD12, MD22, ... and MDN2 are all coupled to BLa2. The gate terminals of the memory transistors MTUC and MTLC of each MD of a common column of MD's are coupled to a separate one of Control Lines CLa1, CLa2, ... CLaN. For example, the gate terminals of both memory transistors of each of MD11, MD21, ... MDM1 are all coupled to CLa1. Each common row of MD has a separate pair of M pairs of Select Lines SL1U and SL1L, SL2U and SL2L, ... SLMU and SLML associated therewith. The gate terminal of the select transistor STUC of the upper memory cell of each MD of a common row of MD's is coupled to the upper select line of the pair of select lines associated with the MD. The gate terminal of the select transistor STLC of the lower memory cell of each MD of a common row of MD's is coupled to the lower select line of the pair of select lines associated with the MD. For example, upper select line SL1U is associated with row 1 of MD's and is coupled to the gate terminals of the STUC's of each of MD11, MD12, ..., MD1N; and lower select line SL1L is associated with row 1 of MD's and is coupled to the gate terminals of STLC of each of MD11, MD12, ... MD1M. The source terminals of all MTUC's and MTLC's are coupled to a power supply source Vrefa.

Each of the bit lines is coupled through a pull-up element (not illustrated) to a voltage source (not illustrated). An example of bit lines of a memory array coupled through pull-up elements to a voltage source is given in FIG. 7 herein. The pull-up elements illustrated in FIG. 7 are field effect transistors.

Figure 4:
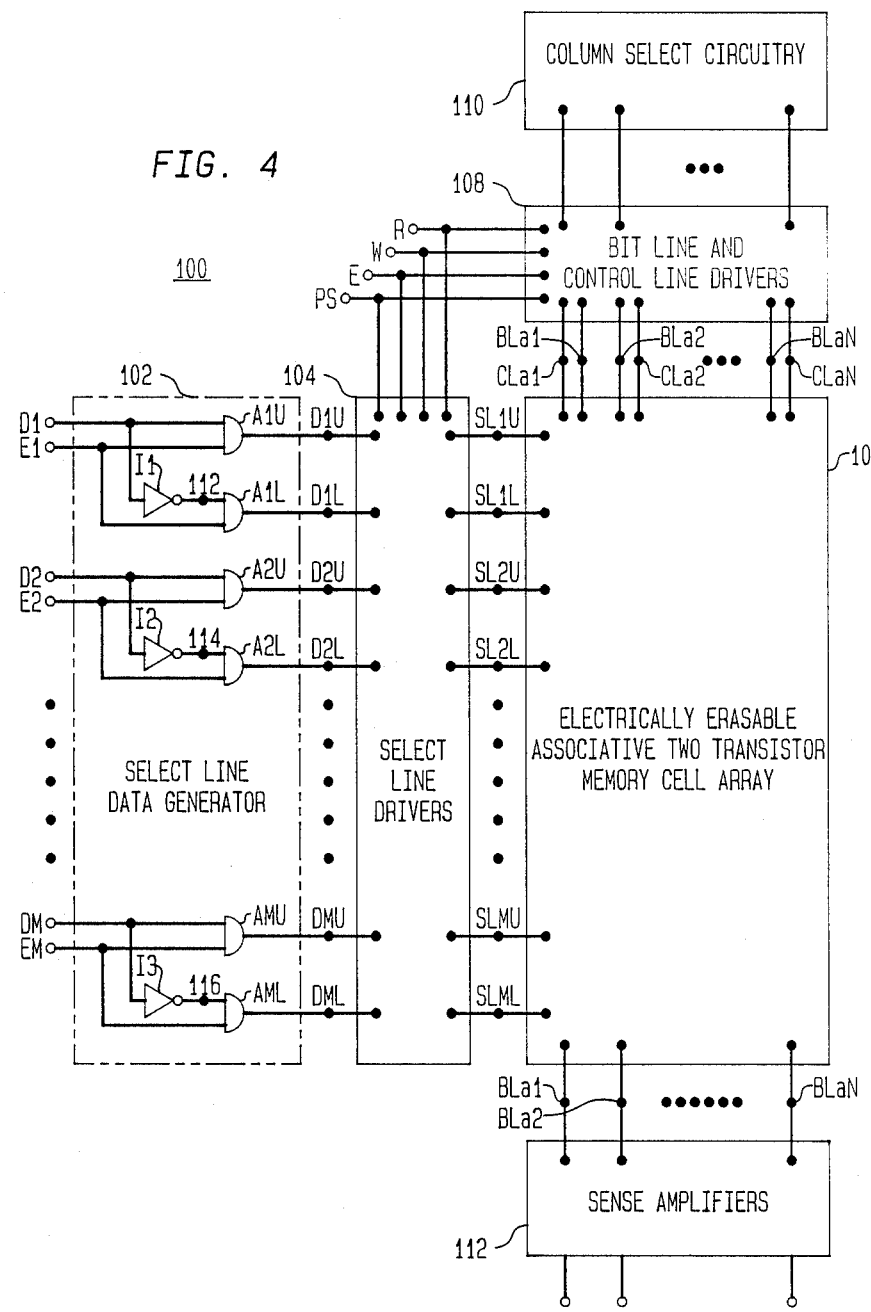
FIG. 4 illustrates an electrically erasable associative memory system (EEAMS) in accordance with the present invention.

Referring now to FIG. 4, there is illustrated an electrically erasable associative memory system (EEAMS) 100 in accordance with the present invention. System 100 comprises a Select Line Data Generator 102, Select Line Drivers 104, a programmable and Electrically Erasable Associative Two Transistor Memory Cell Array which is array 10 of FIG. 3, Bit Line and Control Line Drivers 108, Column Select Circuitry 110, and Sense Amplifiers 112. System 100 provides the function of comparing data applied to input terminals D1, D2 . . . DM with data stored in 10 and providing an output signals indicative of whether or not there is a match.

Select line data generator 102 comprises a plurality of 2M two input AND logic gates, A1U, A1L, A2U, A2L, . . . AMU and AML, a plurality of M inverter circuits I1, I2, . . . IM, M data input terminals D1, D2, . . . DM, M Enable/Disable input terminals E1, E2, . . . EM, and 2M data output terminals D1L, D2U, D2L, . . . DMU, DML.

Data input terminal D1 is coupled to a first input terminal of A1U and to an input terminal of I1. An output terminal of I1 is coupled to a first input terminal of A1L and to a terminal 112. Enable/disable input terminal E1 is a coupled to a second input terminal of A1U and to a second input terminal of A1L. Data Output terminals D1U and D1L are coupled to output terminals of A1U and A1L, respectively. Input data terminal D2 is coupled to a first input terminal of A2U and to an input terminal of I2. An output terminal of I2 is coupled to a first input terminal of A2L and to a terminal 114. Enable/Disable input terminal E2 is coupled to a second input terminal of A2U and to a second input terminal of A2L. Data output terminals D2U and D2L are coupled to output terminals of A2U and A2L, respectively. Input data terminal DM is coupled to a first input terminal of AMU and to first input terminal of I3. An output terminal of I3 is coupled to a first input terminal of AML and to a terminal 116. Enable/disable input terminal EM is coupled to a second input terminal of AMU and to a second input terminal of AML. Data output terminals DMU and DML are coupled to the ouput terminals of AMU and AML, respectively.

Select Line Data Generator 102 generates two output signals for each input data signal. For example, an input data signal applied to D2 results in a first output signal on D2U and a second output signal on D2L. The output signal appearing on D2U is the logical AND of a data signal applied D2 and an enable/disable signal applied to E2. The output signal appearing on D2L is the logical AND of an enable/disable signal applied to E2 and the logical inverse of a data signal applied to D2. The ouput signal appearing on D1U is the logical and of a data signal applied to D1 and an enable disable signal applied to E1. The output signal appearing on D1L is the logical AND of the enable/disable signal applied to E1 and the logical inverse of a signal applied to D1. The output signal appearing on DMU is the logical and of a data signal applied to DM and an enable/disable signal applied to EM. The output signal appearing on DML is the logical AND of an enable/disable signal applied to EM and the logical inverse of a data signal applied to DM. Accordingly, if an enable/disable terminal has a logical "1" applied thereto, the output logical state of the "U" output terminal is the same as the logical state of the data input terminal associated therewith and the logical state of the "L" output terminal is the inverse.

Figure 5:
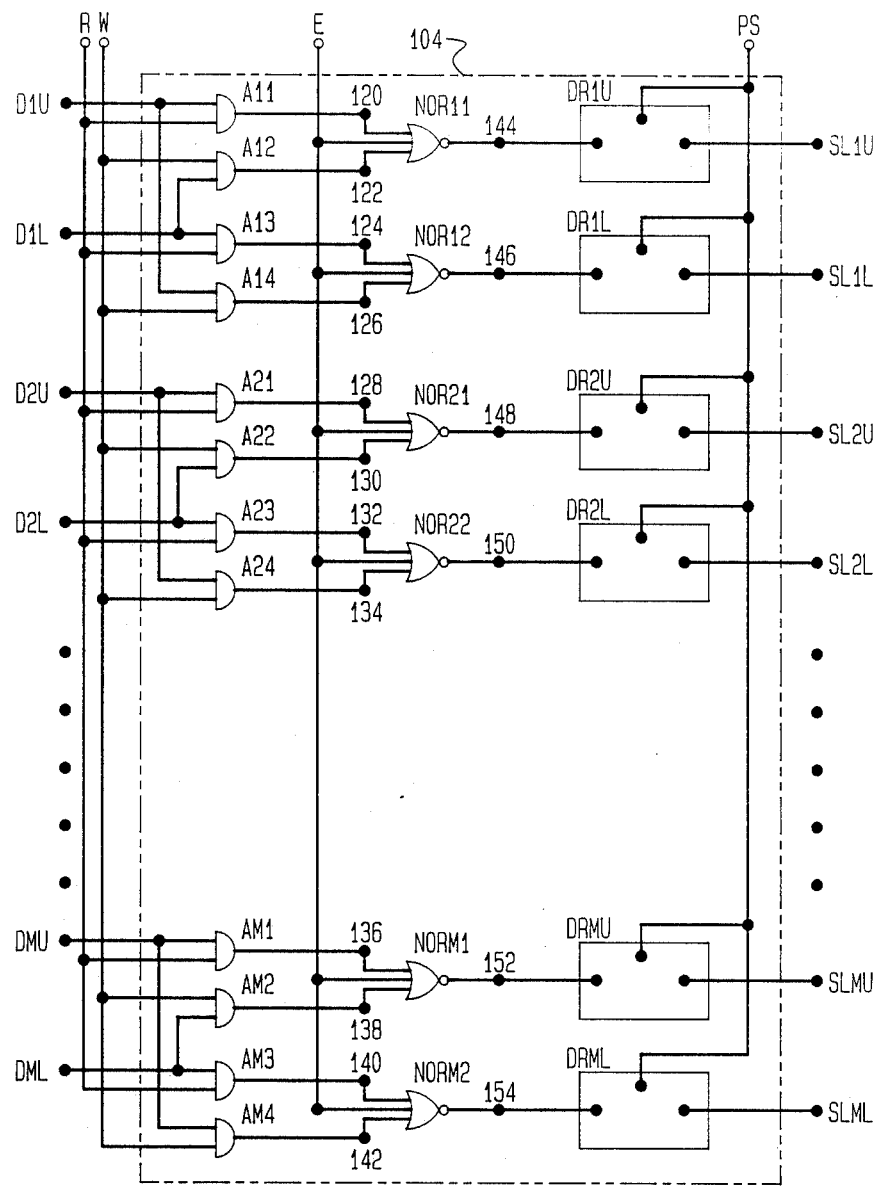
FIG. 5 illustrates one embodiment of portions of the system of FIG. 4.
Figure 6:
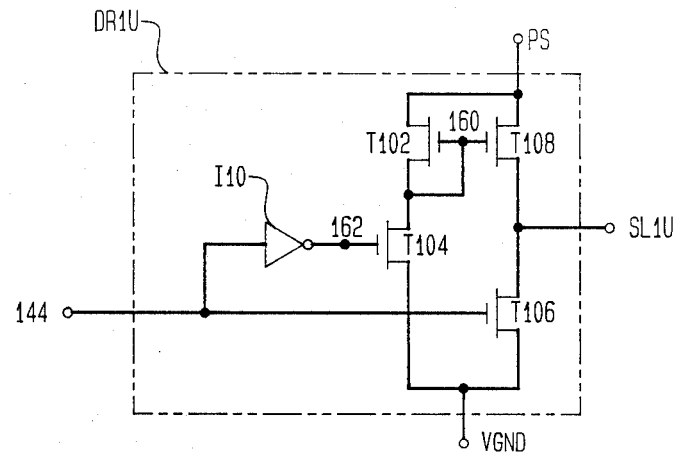
FIG. 6 illustrates one embodiment of a portion of the embodiment of FIG. 5.

Select Line Drivers 104 contains 2M input terminals with each input terminal coupled to a separate one of the data output lines D1U, D1L, D2U, D2L, . . . DMU, DML of 102, and 2M output terminals with each output terminal coupled to a separate one of the select lines SL1U, SL1L, SL2U, SL2L, . . . SLMU, SLML. A typical embodiment of 104 is illustrated in FIGS. 5 and 6 herein.

During the normal associative operation of system 100, the signals appearing on the output terminals of 102 appear on the select line terminals of 10. During a set up operation of system 100, the time during which data is written into the memory devices of 10, the data appearing on each of the U and L output lines of 102 is derived from the L and U input lines, respectively. For example, during a write, the signal on SLMU is derived from DML, and the signal on SLMC is derived from DMU. This interchange is needed during a write operation since the memory devices of 10 store the inverse of the data applied thereto and accordingly, to be able to perform the associative operation, the inverse of what is to be stored must be used as input signals. The interchange of SLMU and SLML lines is equivalent to an inversion when one of the lines carries data and the other carries the opposite, data'. When a "don't care" condition is present, both the data and data' lines both remain low (a "0").

The magnitudes of the "1" levels of the output voltages of 104 are determined by the potential applied to a PS terminal. One of read (R), Write (W), or Erase (E) terminals is selected and a "1" is applied thereto and a "0" is applied to the other two terminals. Different power supply voltages can be applied to the PS terminals as may be desired for the different operations. During a normal associative operation, the signals applied to the select lines are at the normal "1" signal level. During a write operation, the signals applied to the select lines are at a potential Vw which is greater in magnitude than a normal "1" level. During an erase operation, all select lines are driven high, either to VDD or VE. Column Select Circuitry 110, which selects 1 out of N columns, is used during the time data is erased or written into the MD'S but is not used during the normal associative operation. During an erase operation the bit lines of all columns are held low. The column or columns selected by column select circuitry 110 have their corresponding control line driven high, preferably to VE.

Consider the case in which all of the memory cells of 10 have been erased (all contain "0's"). The column select circuitry 110 selects the first column of memory devices and activates same while deactivating all other columns. Data which is to be entered into the two memory cells of each selected MD, is applied to the D input terminals of 102. All of the enable/disable input terminals which are associated with memory cells which are to be selected have a "1" applied thereto. The enable/disable input terminals which are associated with memory cells into which it is desired to write "don't cares" have "0's" applied thereto. A write is performed by driving the "1" outputs of 104 to Vw while the bit line is held at VW by 108. Once data has been loaded into the memory cells of the first column, the first column is deselected and the second column is selected. Data is now entered into the desired memory cells of the second column and the process is repeated until data is entered into all desired columns.

After all the desired data is loaded into the memory cells of 10, the associative operation can begin. All of the bit lines are pulled high (a "1") by pull up elements or precharge means (both not expressly illustrated) which are typically part of sense amplifier 112. Data to be compared to that stored is applied to the data input terminals of 102 and "1's" are applied to all enable/disable input terminals of 102 which correspond to memory devices of 106 in which the associative function is desired. All bit lines (BLal BLaN) which have no current flow stay high ("1's") and represent a match of a word of input data with that stored in a column of memory array 10. All bit lines which have current flowing are pulled low (a "0") and represent a nonmatch.

System 100 has don't care" capability during a write operation which leaves "0's" written into the upper and lower memory transistors of a given memory location. This location then indicates a match independent of the input data. A separate don't care capability is available during the associative operation. Any bit can be disabled so it does not participate in the associative operation. Both of these don't care capabilities are implemented with the same circuitry.

Referring now to FIG. 5, there is illustrated an embodiment of select lines drivers 104 of FIG. 4. Select line drivers 104 comprise a plurality of M portions which each comprise four of AND logic gates A11, A12, A13, A14, A21, A22, A23, A24, . . . AM1, AM2, AM3 and AM4, each having two input terminals and an output terminal, two of NOR logic gates NOR11, NOR12, NOR21, NOR22, . . . NORM1 and NORM2, each having three input terminals and an output terminal, and two of inverting drivers circuits DR1U, DR1L, DR2L, DR2U, . . . DRMU, and DRML, each having an input terminal, an output terminal and a PS power supply terminal. Each of the M portions of 104 has its inputs coupled to a separate pair of data lines of select line data generator 102 of FIG. 4 and has its outputs coupled to a separate pair of the select lines of the electrically erasable associative two transistor memory cell array 10 of FIG. 4.

A first of the M portions of 104 comprises AND logic gates A11, A12, A13, and A14, NOR logic gates NOR 11, and NOR 12, and inverter-driver circuits DR1U and DR1L. First input terminals of A11 and A14 are coupled to data line D1U of FIG. 4. A second input terminal of A12 and a first input terminal of A13 are coupled to data line D1L of FIG. 4. Second input terminals of A11 and A13 are coupled to the Read R input terminal of FIG. 4. A first input terminal of A12 and a second input terminal of A14 are coupled to the Write W input terminal of FIG. 4. An ouput terminal of A11 is coupled to a first input terminal of NOR 11 and to a terminal 120. An output terminal of A12 is coupled to a third input terminal of NOR11 and to a terminal 122. An output terminal of A13 is coupled to a first input terminal of NOR12 and to a terminal 124. An output terminal of A14 is coupled to a third input terminal of NOR12 and to a terminal 126. Second input terminals of NOR11 and NOR12 are coupled to the Erase E terminal of FIG. 4. An output terminal of NOR11 is coupled to an input terminal of DR1U and to a terminal 144. An output terminal of NOR12 is coupled to an input terminal of DR1L and to a terminal 146. An output terminal of DR1U is coupled to select line SL1U of FIG. 4. An output terminal of DR1L is coupled to select line SL1L of FIG. 4. Voltage supply terminals of DR1U and DR1l are coupled to terminal PS of FIG. 4.

A second portion of the M portions of 104 comprises A21, A22, A23, A24, NOR21, NOR22, DR2U and DR2L and is coupled to terminals D2U, D2L, SL2U and SL2L. An Mth portion of 104 comprises AM1, AM2, AM3, AM4, NORM1, NORM2, DRMU and DML and is coupled to DMU, DML, SLMU and SLML. Each of these portions is also coupled to the R, W, E, and PS terminals. The actual interconnects of all of the M portions are illustrated and are essentially the same as is illustrated and described for the first of the M portions.

Select line drivers 104 operates as follows: One of the R, W, or E terminals is set to a "1" and the others are set to "0". The potential applied to the PS terminal is a function of whether a read (associative), write, or erase operation is to be performed. For a read operation R="1", W="0", E="0", and PS=VDD. For a write operation W="1", R="0", E="0", and PS=VW. For an erase operation E="1", R="0", W="0", and PS=VE.

Assume that R=E="0", W="1", PS=VW, D1U="1" and DIL="0". These are the conditions for a write operation. The outputs of A11, A12, A13 and terminal E are all "0's" and the output of A14 is a "1". The three input terminals of NOR11 are "0's" and therefore the output terminal 144 of NOR11 is "1". DR1U is an inverting-buffer and therefore the ouput at terminal SL1U is a "0". The output signal of A13 and the signal applied to terminal E are both "0's" and the output signal of A14 is a "1". Since one of the input terminals (terminal 126) of NOR12 is a "1", the output signal appearing on terminal 146 of NOR12 is a "0". Since DR1L is an inverting-buffer, the signal at terminal SL1L is a "1". All other of the M portions of 104 operate in the same manner as the first portion.

Now assume that R="1", E=W="0", PS=VW, DIU="1", and the DIL="0". These are the conditions for a read (associative) operation. The outputs of A12, A13, and A14 are "0's". Input terminals 120 of NOR11 is a "1" and therefore output terminal 144 of NOR11 is a "0". The three input terminals of NOR12 are "0's" and therefore output terminal 146 of NOR12 is a "1". The output signals at SL1U and SL1L are "1" and "0", respectively. Thus with the data applied to D1U and D1L being held the same during a read (associative) and write operation, the output signals at SL1U and SL1L reverse.

Referring now to FIG. 6, there is illustrated within the dashed line rectangle a typical embodiment of inverter-buffer DR1U of FIG. 5. DR1U comprises field effect transistors T102, T104, T106 and T108 and inverter circuit I10. DR1U operates as an inverter-buffer. In one preferred embodiment T104 and T106 are n-channel field effect transistors and T102 and T108 are p-channel field effect transistors. All of the other DR's of FIG. 5, DR1L, DR2L, DR2U, . . . DRMU and DRML, are essentially identical in configuration and operation to the DR1U illustrated in FIG. 6.

The sources of T102 and T108 are coupled to power supply terminal PS. The gates of T102 and T108 are coupled to the drains of T102 and T104 and to a terminal 160. The gate terminal of T104 is coupled to an output terminal of I10 and to a terminal 162. An input terminal of I10 is coupled to a gate terminal of T106 and to a terminal 144 of FIG. 5. The sources of T104 and T106 are coupled together to a source of potential VGND. The drains of T106 and T108 are coupled together to terminal SL1U of FIG. 4.

DR1U operates as follows: With a positive voltage supplied to terminal PS and ground potential applied to terminal VGND, a "0" applied to terminal 144 biases off T106. T104 is biased on since I10 causes the "0" applied to terminal 144 to result in a "1" on terminal 162. This pulls terminal 160 towards ground potential which biases on T102 and T108. The ratio of the transconductances of T102 and T104 is selected such with T102 and T104 biased on that the potential of terminal 160 is not far below that of the source of T102 which is PS in this case. Since T108 is biased on and T106 is biased off, SL1U charges up close to the "1" potential level applied to PS. Thus with a "0" input signal applied to input terminal 144, the output signal of 104 which appears on terminal SL1U is a "1" (the potential applied to PS). With a "1" applied to input terminal 144, T104 is biased off and T106 is biased on. Terminal 160 charges towards the potential of PS which biases off T102 and T108. This causes terminal SL1U to be discharged to ground potential, a "0". Thus with a "1" applied to terminal 144, a "0" appears at terminal SL1U. Accordingly, DR1U performs an inverter-buffer function with the output "1" level being determined by the potential level applied to the PS terminal.

Referring now to FIG. 7, there is illustrated the basic components of a prior art programmable logic array which are also illustrated and described in the book entitled "Introduction to VLSI Systems" by Carver Mead (one of the present inventors) et al, pages 80-82. Input signals A, B, and C and generated complements thereof are input signals to a first array (illustrated as part of an AND plane) of read only memory cells with the presence of a single field effect transistor at a cross point of a vertical and a horizontal line being indicative of a "1" stored at that location and the absence of a field effect transistor at a cross point of a vertical and horizontal line being representative of a "0" stored at that location. Each horizontal line of the AND plane carries the NOR combination of all input signals that are coupled to the gates of the transistors which are coupled to that horizontal line. For example, the horizontal row labeled R3 has three transistors attached to it in the AND plane, one controlled by A, one by B, and one by C'. If any of these inputs is high, a "1", then R3 is pulled down toward ground and low, a "0". Thus, $$R3 = (A + B + C')' = A'B'C.$$

Similarly, $$R4 = (A + B' + C)' = A'BC'.$$

The OR plane matrix of circuit elements is identical in form to the AND plane matrix, but rotated 90 degrees. Once again, each of its outputs is the NOR of the signals leading to the gates of all transistors attached to it. For example, both R3 and R4 lead to the gates of transistors leading from the output line Z4' to ground. If either R3 or R4 is high, Z4 will be low. Thus, $Z4' = NOR(R3, R4) = (A'B'C + A'BC')'$. Up to this point the PLA implements the NOR-NOR canonical form of Boolean function of its inputs.

The output lines of the OR plane matrix are run into inverting drivers. Note that the output Z4 at this point is $Z4 = A'B'C + A'BC'$. This expression illustrates why the two PLA planes, each implementing the NOR function, are usually referred to as the AND plane and the OR plane. The outputs Z1, Z2, Z3, and Z4 appear directly as the sum of products canonical form of Boolean functions of the PLA inputs, that is, as the OR of AND terms. Each horizontal line of the PLA carries one product term.

Figure 8:
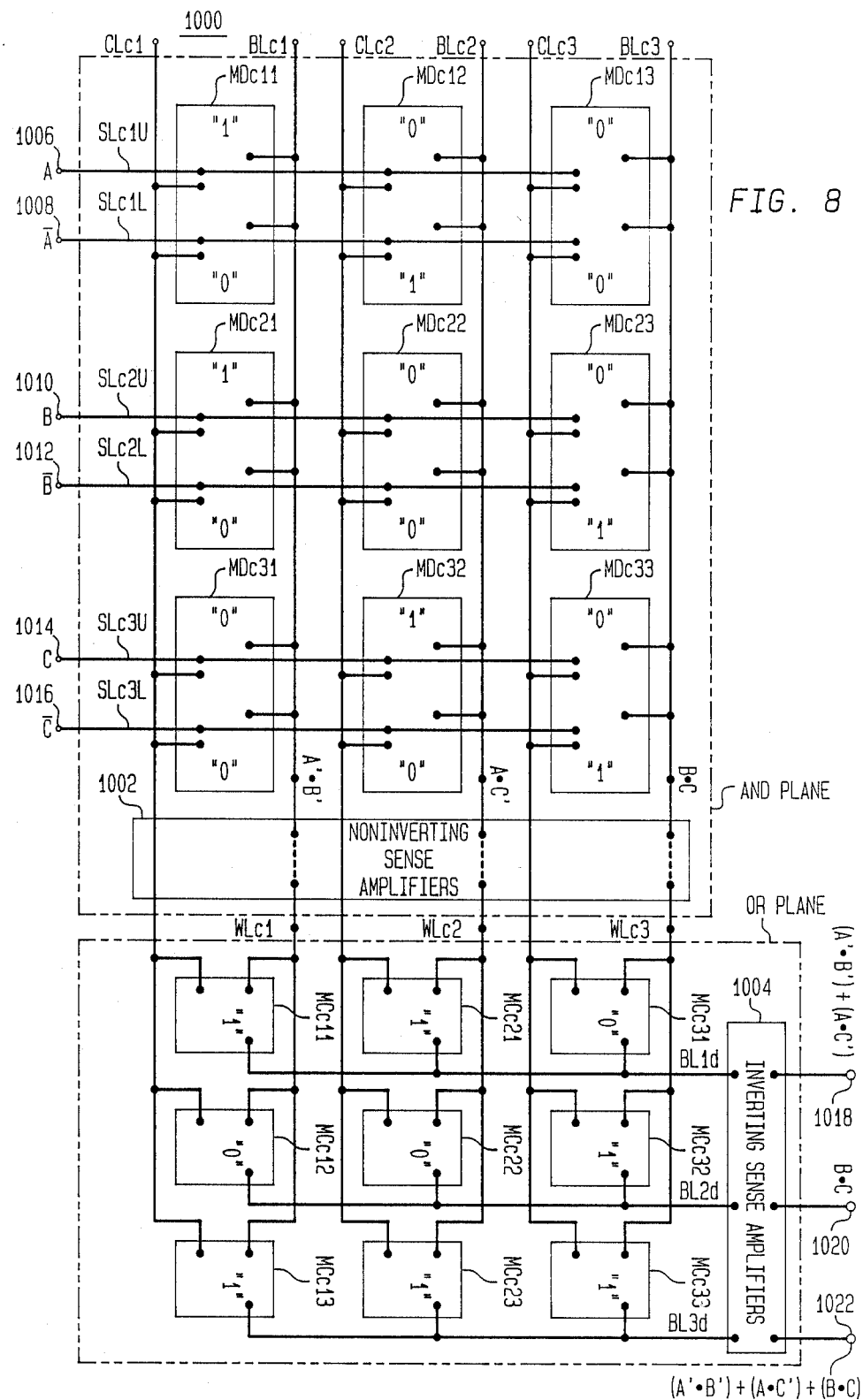
FIG. 8 illustrates an electrically erasable programmable logic array which is programmed to provide a preselected logic function and is in accordance with the present invention.

Referring now to FIG. 8, there is illustrated one specific example of an electrically erasable programmable logic array (PLA) 1,000 in accordance with the present invention which has been programmed to provide a preselected logic function. Array 1,000 comprises an AND plane (illustrated within a dashed line rectangle) and an OR plane (illustrated with another dashed line rectangle). The AND plane comprises an array of memory devices having three rows and three columns of memory devices MDc's which include MDc11, MDc12, MDc13, MDc21, MDc22, MDc23, MDc31, MDc32 and MDc33. Each MDc is identical to the memory devices MD of FIG. 3. The memory array of the AND plane contains bit lines BLc1, BLc2, and BLc3, select lines SLc1U, SLc1L, SLc2U, SLc2L, SLc3U, SLc3L, and control lines CLc1, CLc2, and CLc3, and noninverting sense amplifiers 1,002. Amplified 1,002 are in some cases optional. The OR plane comprises an array of memory cells MCc's which include MCc11, MCc12, MCc13, MCc21, MCc22, MCc23, MCc31, MCc32 and MCc33 and inverting sense amplifiers 1,004. Each MCc is essentially identical to the MC's of FIG. 1. The memory array of the OR plane contains bit lines BLd1, BLd2, and BLd3, word lines WLc1, WLc2, and WLc3, and control lines CLc1, CLc2, and CLc3. The control lines are identical to the control lines of the AND plane. This is optional and the control lines of the AND and OR Planes can be separate. The bit lines of the AND plane, BLc1, BLc2, and BLc3, couple either directly to word lines WLc1, WLc2, and WLc3, respectively, or couple to these word lines through 1,002. Each of the bit lines of the OR plane couple through inverting sense amplifiers 1,004 to a separate one of three output terminals 1,018, 1,020, and 1022 of 1,004. Terminals 1,018, 1,020, and 1,022 serve as PLA 1,000 output terminals.

An input terminal 1,006 is coupled to SLc1U, to all the upper memory cells of the MDc's of the first row of MDc's, and to a source of a logic signal A. An input terminal 1,008 is coupled to SLc1L, to all the lower memory cells of the MDc's of the first row of MDc's, and to a source of a signal A' which provides the inverse of the logic signal A. Input terminals 1010 and 1012 are likewise coupled to SLc2U and SLc2L, respectively, to the upper and lower memory cells of the second row of MDc's, respectively, and to sources of complementary signals B and B', respectively. Likewise, input terminals 1014 and 1016 are coupled to SLc3U and SLc3L, respectively, to the upper and lower memory cells of the third row of memory devices, respectively, and to sources of complementary signals C and C', respectively.

Each of the bit lines of the AND Plane is typically coupled through a separate load device (not illustrated) to a first positive potential power supply (not illustrated). Each of the bit lines of the OR Plane is typically coupled through a separate load device (not illustrated) to a second power supply (not illustrated).

PLA 1,000 has been programmed to provide a specific logic function and each MDc is illustrated containing a "1" or a "0" in each of the upper memory cells and a "1" or a "0" in each of the lower memory cells. In some cases an MDc has a "0" in both the upper and lower memory cells thereof. These locations are denoted as don't care locations and the MDc's at these locations do not play a role in the logic function of PLA 1,000. The logic signals appearing on bit lines BLc1, BLc2, and BLc3 are $A' \cdot B'$, $A \cdot C'$, and $B \cdot C$, respectively. The logic output of PLA 1,000 is given on output terminals 1,018, 1,020, and 1,022 as $(A' \cdot B') + (A \cdot C')$, $B \cdot C$, and $(A' \cdot B') + (A \cdot C') + (B \cdot C)$, respectively.

PLA 1,000 can be repeatedly reconfigurable by an end user since the data is stored in each of the memory cells of each memory device MCc and each of the memory cells can be easily changed.

Figure 9:
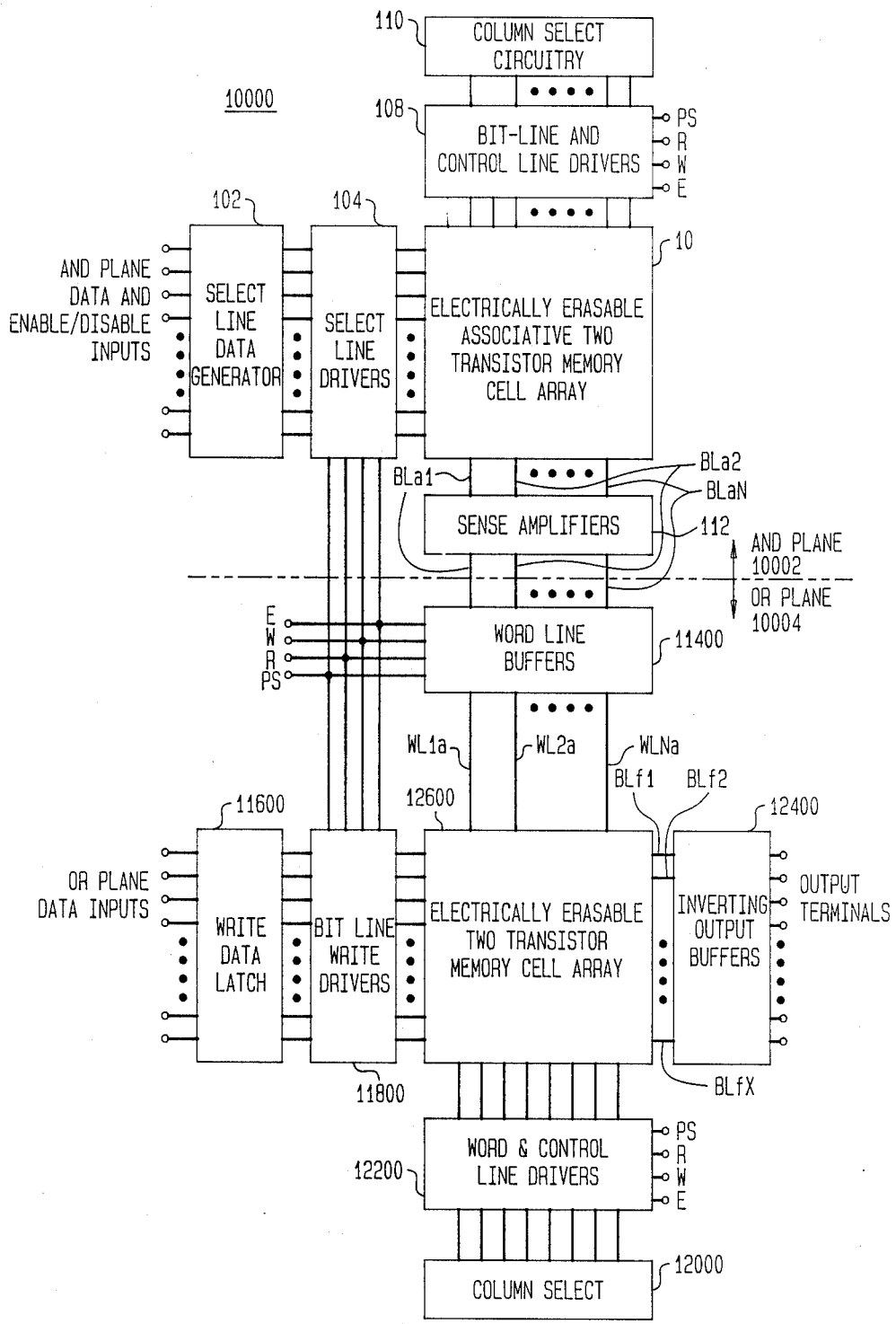
FIG. 9 illustrates an electrically erasable programmable logic array system in accordance with the present invention.

Referring now to FIG. 9, there is illustrated an electrically erasable programmable logic array system (EE-PLAS) 10,000. EEPLA 10,000 uses the basic electrically erasable associative memory system 100 of FIG. 4 as an AND plane 10,002 and the array of memory cells of FIG. 1 with inverting output buffers as an OR plane 10,004. All components of the AND plane which are essentially identical to those of system 100 of FIG. 4 have the same reference number or a reference number with "00" added thereafter. All of the logical blocks and the electrically erasable associative array above the dashed line are considered part of the AND plane and the logical blocks and memory array below the dashed line are considered part of the OR plane. The combination of the AND and OR planes is essentially as exists in PLA 1,000 of FIG. 8.

EEPLAS 10,000 can be configured to do a wide variety of different logic functions by writing into the associative array of the AND plane and the memory array of the OR plane whatever data patterns are desired. EEPLAS 10,000 includes select line data generator 102, select line drivers 104, column select circuitry 110, bit line and control line drivers 108 and sense amplifiers 112 which allow data to be written into, read out of and/or erased from the electrically erasable associative memory array 10 of the AND plane. It also includes word line buffers 11,400 write data latch 11,600, bit line write drivers 11,800, column select circuitry 12,000, word and control line drivers 12,200 and inverting output buffers 12,400 which allow data to be written into, read out of and/or erased from the electrically erasable memory array 12,600 of the OR plane. The select line data generator 102 is essentially the same as the select line generator 102 of FIG. 4 but may include data and enable latches, if desired. The details of the circuits used to form all logical blocks of system 10,000 are well known in the art. The electrical erasable array of the AND plane can be an M×N array of devices with the electrically erasable array of the OR plane being a N×X array of memory cells.

In one embodiment of the present invention the sense amplifiers 112 and the word and control line drivers 11,400 are replaced by wires as is illustrated in FIG. 8.

In this embodiment a separate OR plane column select 12,000 and word and control line drivers 12,200 are not needed.

The memory cells of any column of the device array of the AND plane and the memory cell array of the OR plane can have data written therein by providing AND data, enable/disable data, OR data, and performing a write operation on both planes simultaneously. It is desirable to write or erase a column of both planes together. Accordingly, in a preferred embodiment of the present invention, the column select signal used should be the same for both planes. The capability of being able to write or erase a column of the AND and OR planes at the same time allows one line of a finite-state machine to be programmed when the PLA is used as a finite-state machine since each column represents one line of finite state machine code. This feature also allows a line of code to be written or re-written at run time. This capability is not known to exist in the art today. The data to be written can be derived from the run-time situation even though it was not known previously. Thus a finite-state machine which uses the PLA of the present invention can make practical use of run-time self-modification.

Figure 10:
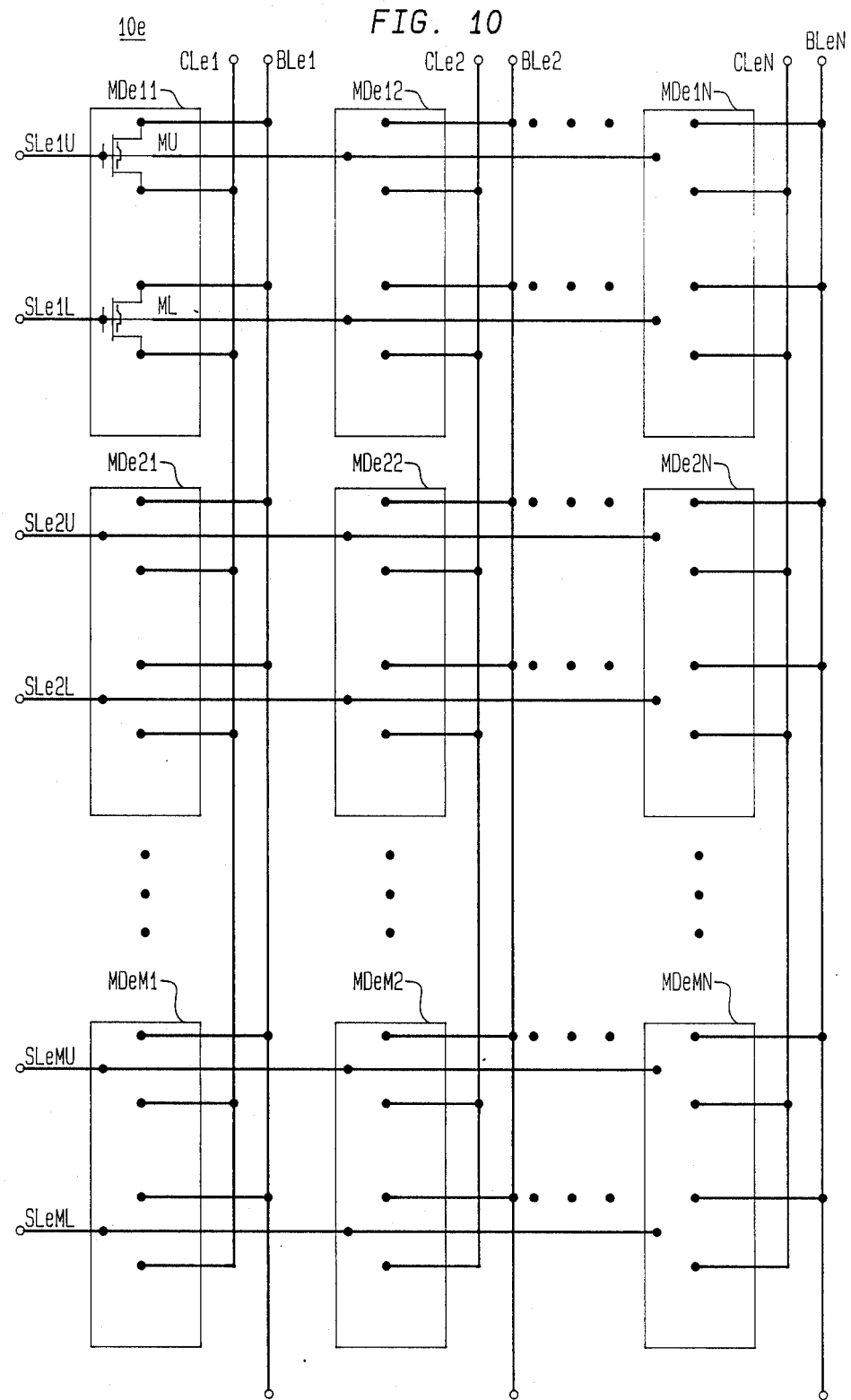
FIG. 10 illustrates still another embodiment of an array of devices in accordance with the present invention.

Referring now to FIG. 10, there is illustrated a programmable and electrically erasable nonvolatile array 10e of memory devices MDe arranged in M rows and N columns in accordance with the present invention. M and N are positive integers. The numbers following each MDe denote the location of that memory device in the array. For example, memory device MDe21 is in the second row and first column. Each MDe comprises two separate memory cells (an upper cell and a lower cell) which are each essentially identical and each comprise a single field effect transistor having an electrically floating gate region. The transistor of the upper cell is denoted as MU and the transistor the lower cell is denoted as ML. Each MDe is capable of storing two bits of information, a first in the upper cell and a second in the lower cell.

Examples of single field effect transistor nonvolatile memory cells which merge the selection and memory transistors of the memory cell of FIG. 1 are described and illustrated in the articles entitled "Low-power EE-PROM Can Be Reprogrammed Fast" by E. K. Sketon, Electronics, July 31, 1980, pages 89–91 and "A SHIELDED SUBSTRATE INJECTOR MOS (SSIMOS) EEPROM CELL" by R. G. Stewart et al, Technical Digest, DECEMBER, 1984, International Electronic Devices Meeting. MDd of the present invention can be the memory cell described in the above-described reference or a variety of other memory cells which effectively merge the selection and memory transistors into a single transistor having gate, drain and source terminals.

For illustrative purposes, the transistors are assumed to be n-channel. The drains of all MU's and ML's of a common column of MDe's are coupled to a separate one of Bit Lines BLe1, BLe2, . . . BLeN. For example, the drain terminals of MU and ML of each of the MDe's of the first column of array 10e are all coupled to BLe1. Each common row of MDd's has a separate pair of M pairs of select lines SLe1U and SLe1L, and SLe2U and SLe2L, . . . SLeMU and SLeML associated therewith. The gate terminal of each MU of a common upper row of MDe's is coupled to a upper select line SLeU and the gate terminal of each ML of a common lower row of MDe's is coupled to a lower select line SLeL. For example, SLe1U is coupled to the gate terminals of the MU's of the first row of MDd's and SLe1L is coupled to the gate terminal of each MU of the first row of MDe's. The source terminal of each MU of a given column of MDe's are coupled together to one of a plurality of control lines CLe1, CLe2, . . . CLeN.

Each of the bit lines is coupled through a pull-up element (not illustrated) to a voltage source (not illustrated). An example of bit line of a memory array coupled through pull-up elements to a voltage source is given in FIG. 7 herein. The pull-up elements illustrated in FIG. 7 are field effect transistors.

Figure 11:
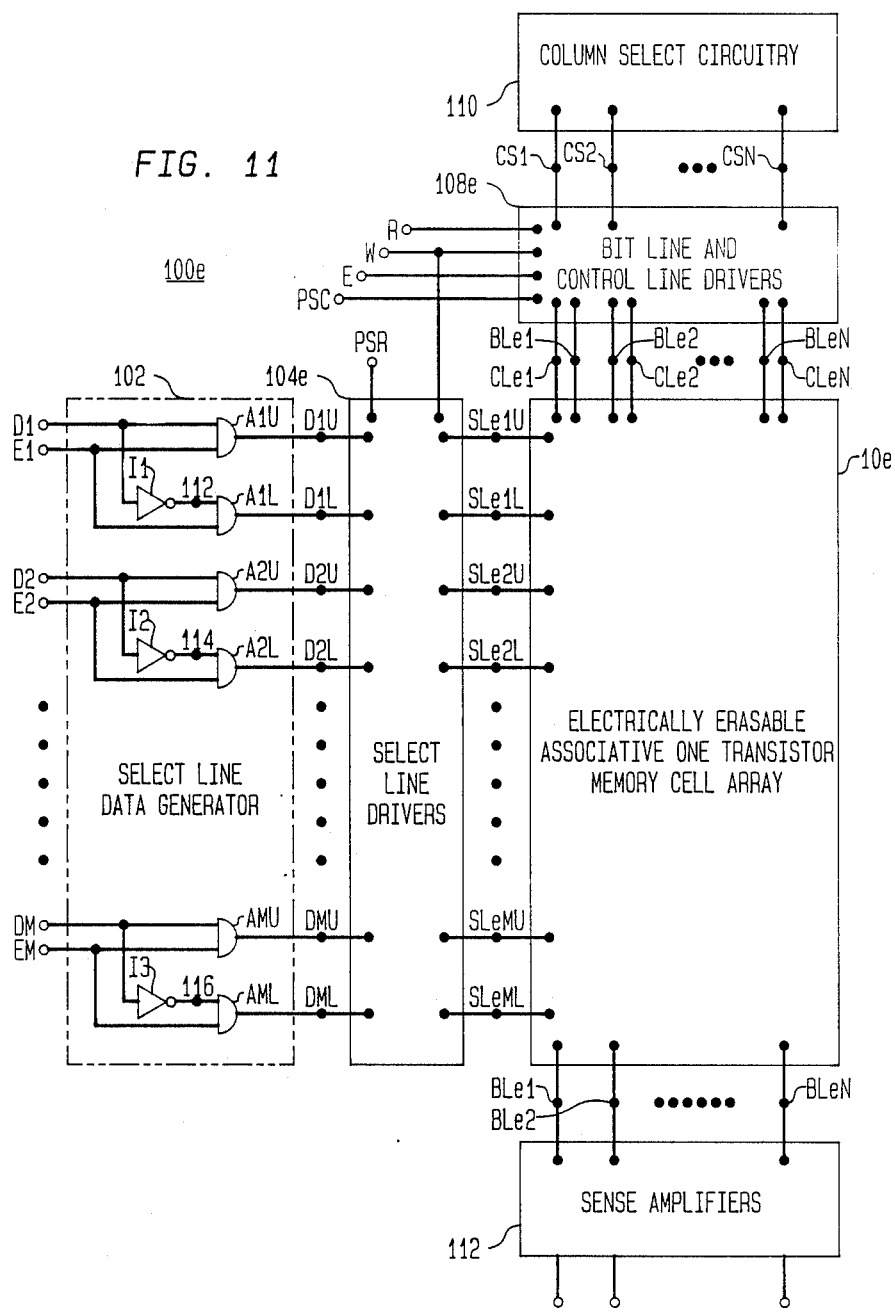
FIG. 11 illustrates still another embodiment of an electrical erasable associative memory system in accordance with the present invention.

Referring now to FIG. 11 there is illustrated an electrically erasable associated memory system (EEAMS) 100e in accordance with the present invention. System 100e comprises a programmable and electrically erasable associative one transistor memory cell array 10e of the kind illustrated in FIG. 10, select line data generator 102, bit line and control line drivers 108e, select line drivers 104e, column selection circuitry 110, and sense amplifiers 112. System 100e performs the same basic function as system 100 of FIG. 4 and select line generator 102, column select circuitry 110, and sense amplifiers 112 are essentially the same as in FIG. 4.

For a read (associative) operation, the data is applied to the select lines, 0 volts is applied to the control lines, and the potential of the bit lines are sensed.

To erase (write a "0" into) any location, the bit and control lines (which are coupled to the source and drain terminals of the transistor of each memory cell) are held at 0 volts and a potential VE is applied to the select line of a selected row of devices. Select lines for memory locations which are not to be modified have 0 volts applied thereto. Bit and control lines for columns of devices that are deselected have an intermediate voltage, approximately VE/2, applied thereto. The tunneling current used for writing or erasing is an exponential function of the field created which is directly proportional to the gate to channel voltage. The deselected memory cells have only one-half of the write or erase voltage applied thereto and therefore the tunneling currents generated are orders of magnitude smaller than those in the memory cells which have the full write or erase voltage applied thereto. The deselected memory cells are therefore essentially undisturbed.

Array 10e can have all of the memory cells of a common column written or erased at a time or can have just a single memory cell written or erased at a time.

To write a "1" into any location, the select line has 0 volts applied thereto and the selected control and bit lines have VW volts applied thereto. Rows which are deselected (i.e. those which are to retain existing data stored in the memory cells thereof) have a voltage of VM/2 applied to the corresponding select lines. Deselected columns have 0 volts applied to the corresponding bit and control lines.

Because the write "1" and erase (write "0") conditions are symmetrical in the row and column, the data can be applied to row (select lines) and a single column selected, or vice-versa.

Figure 12:
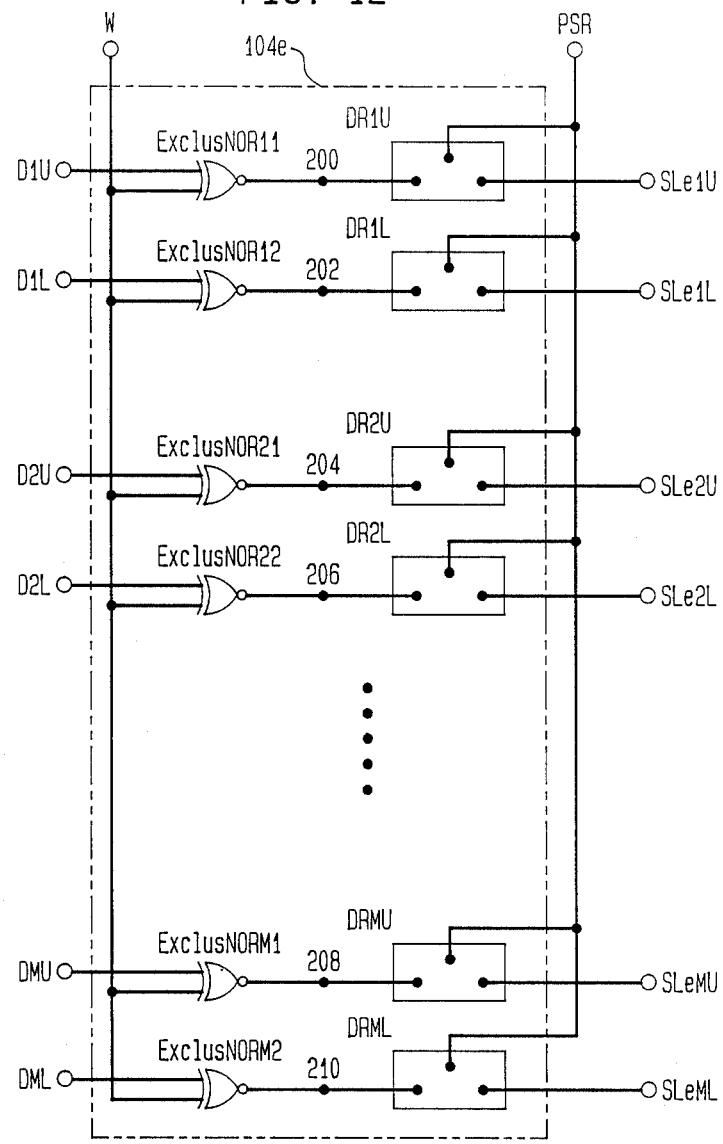
FIG. 12 illustrates one embodiment of a portion of the system of FIG. 11.

Referring now to FIG. 12, there is illustrated an embodiment of the select line drivers 104e of FIG. 11 which comprises two input exclusive NOR logic gates ExclsNOR11, ExclsNOR12, ExclusNor21, ExclsNOR22, . . . ExclsNORM1, and ExclsNORM2 and driver-inverters DR1U, DR1L, DR2U, DR2L, . . . DRMU and DRML. The driver-inverters are essentially the same as the driver-inverter illustrated in FIG. 6. A write (W) terminal is coupled to second input terminals of all of the exclusive NOR logic gates. A row power supply terminal (PSR) is coupled to a power supply terminal of each of the driver-inverters. Input terminals D1U, D1L, D2U, D2L, . . . DMU, and DML are coupled to first inputs terminals of exclusive NOR gates 11, 12, 22, . . . M1 and M2, respectively. Output terminals of DR1U, DR1L, DR2U, DR2L, . . . DRMU and DRML are coupled to select lines SLe1U, SLe1L, Sle2U, Sle2L, . . . SLeMU and SLeML, respectively. Output terminals of the exclusive NOR gates 11, 21, 22, and M1 and M2 are coupled to terminals 200, 202, 204, 206, 208, and 210, respectively, and to input terminals of DR1U, DR1L, DR2U, DR2L, and DRUM and DRML, respectively.

The potential applied to PSR changes as a function of the operation being performed. For the read (associative), write, and erase operations the potential applied to PSR is VDD, VM/2, and VE, respectively.

Figure 13:
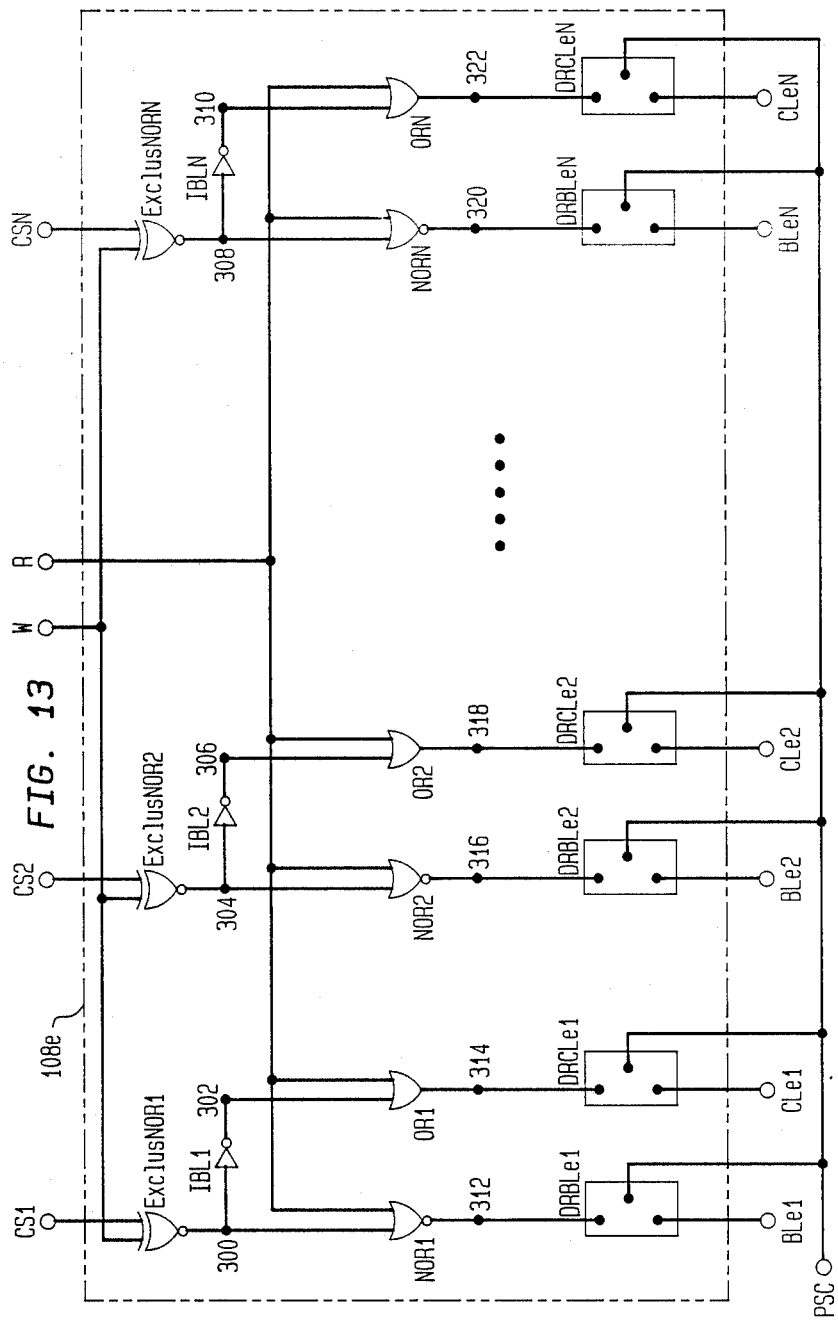
FIG. 13 illustrates one embodiment of another portion of the system of FIG. 11.

Referring now to FIG. 13, there is illustrated an embodiment of the bit line and column line drivers 108e of FIG. 11 which comprises two input exclusive NOR gates exclsNOR1, exclusNor 2, . . . exclusNORN, inverter circuits IBL1, IBL2, . . . IBLN, NOR logic gates NOR1, NOR2, . . . NORN, OR logic gates OR1, OR2, . . . ORN, bit line driver-inverters DRBLe1, DRBLe2, . . . DRNLeN and control line driver-inverters DRCLe1, DRCLe2, . . . DRCLeN. First input terminals of the exclusive NOR logic gates are all coupled to a write terminal (W).

First input terminals of exclsNOR1, exclusNOR2, . . . exclusNORN are coupled to terminals CS1, CS2, . . . CSN, respectively, which are coupled to the column select circuitry 110 of FIG. 11. An output terminal of exclusNOR1 is coupled to an input terminal of IBL1, to a first input terminal of NOR1, and to a terminal 300. An output terminal of IBL1 is coupled to a first input terminal of OR1 and to a terminal 302. An output terminal of exclusNOR2 is coupled to an input terminal of IBL2, to a first input terminal of NOR2, and to a terminal 304. An output terminal of IBL2 is coupled to a first input terminal of OR2 and to a terminal 306. An output terminal of exclusNORN is coupled to an input terminal of IBLN, to a first input terminal of NORN, and to a terminal 308. An output terminal of IBLN is coupled to a first input terminal of ORN and to a terminal 310. Second input terminals of NOR1, OR1, NOR2, OR2, . . . NORN and ORN are coupled to a read terminal (R).

An output terminal of NOR1 is coupled to an input terminal of DRBLe1 and to a terminal 312. An output terminal of OR1 is coupled to an input terminal of DRCLe1 and to a terminal 314. An output terminal of NOR2 is coupled to an input terminal of DRBLe2 and to a terminal 316. An output terminal of OR2 is coupled to an input terminal of DRCLe2 and to a terminal 318. An output terminal of NORN is coupled to an input terminal of DRBLeN and to a terminal 320. An output terminal of ORN is coupled to an input terminal of DRCLeN and to a terminal 322. Output terminals of DRBLe1, DRCLe1, DRBLe2, DRCLe2, . . . DRBLeN and DRCLeN are coupled to terminals BLe1, CLe1, Ble2, CLe2, . . . BLeN, and CLeN, respectively, which are each coupled to a separate bit line or to a separate control line of array 10e.

Power supply terminals of DRBLe1, DRCLe1, DRBLe2, DRCLe2, . . . DRBLeN and DRCLeN are coupled to a column power supply terminal PSC. The potential applied to PSC changes as a function of the operation being performed. For the read, write, and erase operations, the potential applied to PSC is 0 volts, VW, VE/2, respectively.

Figure 14:
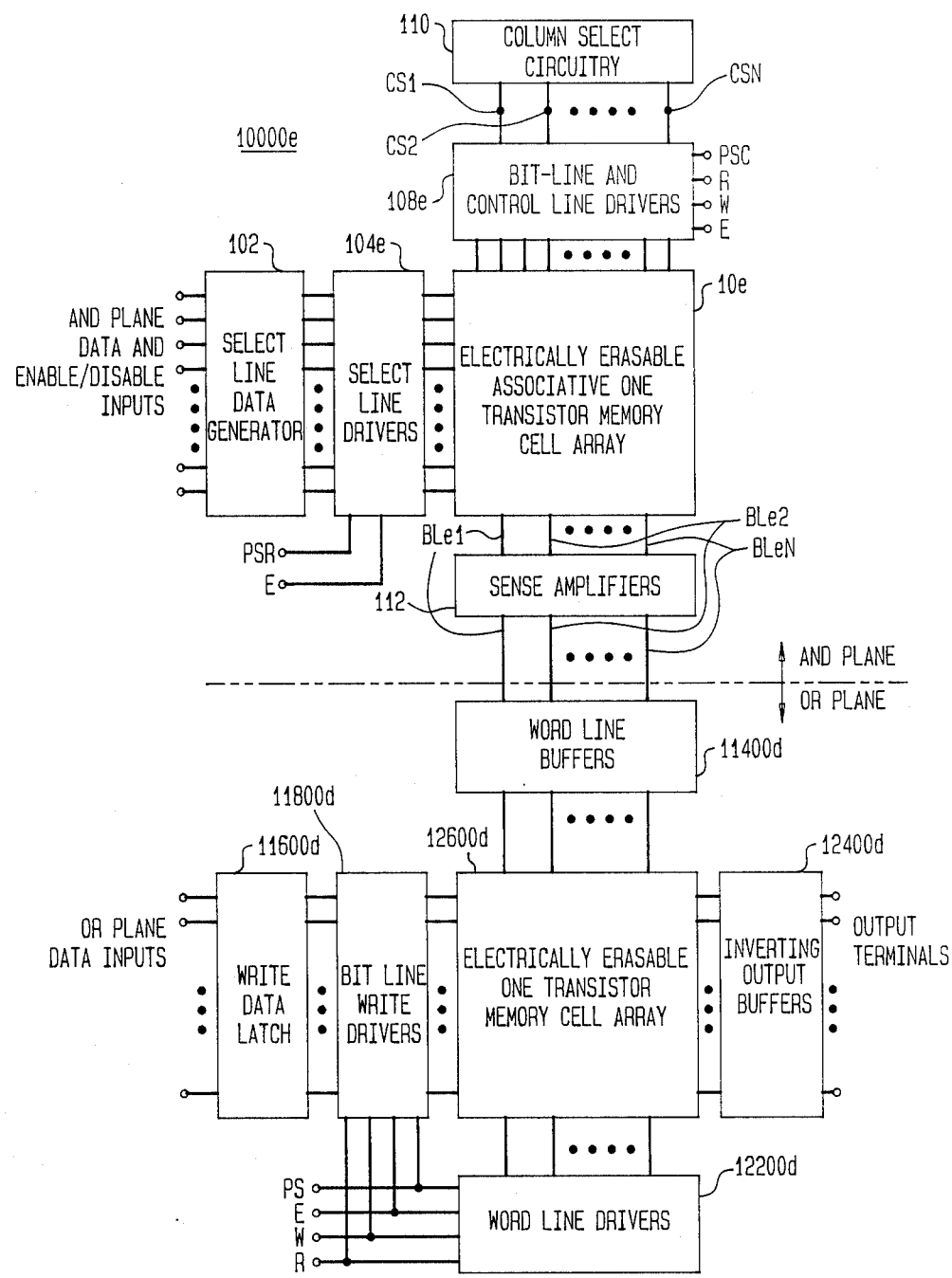
FIG. 14 illustrates still another embodiment of an electrically erasable programmable logic system in accordance with the present invention.

Referring now to FIG. 14, there is illustrated an electrically programmable logic array system (EEPLAS) 10,000e. EEPLA system 10,000e uses the basic associative memory system 100e of FIG. 11 as an AND plane and the OR plane of FIG. 10. All components of the AND plane which are essentially identical to those of system 100e of FIG. 11 have the same reference number. All of the logical blocks and the array above the dashed line are considered part of the AND plane and the logical blocks and array below the dashed line are considered part of the OR plane. The combination of the AND and OR planes is essentially as exists in EEPLA 10,000 of FIG. 9.

EEPLA 10,000e can be configured to do a wide variety of different logic functions by writing into the associative array of the AND plane and the memory array of the OR plane whatever data patterns are desired. EEPLAS 10,000e includes select line data generator 102, select line drivers 104e, bit line and control line drivers 108e, column selection circuitry 110, and sense amplifiers 112 which allow data to be written into, read out of and/or erased from array 10e of the AND plane. It also includes together with an electrically erasable one transistor memory cell array 12,600d, word line buffers 11,400d, write data latch 11,600d, bit line write drivers 11,800d, inverting output buffers 12,400d, word line drivers 12,200d, which allow data to be written into, read out of and/or erased from 12,600d.

Array 10e can be an M×N array of devices and array 12,600d being an N×X array of memory cells.

It is to be understood that the embodiments described herein are merely illustrative of the general principles of the invention. Various modifications are possible within the scope of the invention. For example, the select line data generator and drivers can utilize a wide variety of circuitry which is different than that illustrated but which performs the same function. Further, the AND and OR plane data and enable/disable input terminals can be merged to save on terminals by using known multiplexing circuitry and known techniques. Still further, the pull-up elements can be resistors or can be replaced with precharge field effect transistors which are turned on to set the potential of the bit lines to a level at or near the voltage source coupled thereto and then are turned off. Still further, the sense amplifiers and word line buffers can be merged into a inter-plane buffer. Further, the memory cells can replaced with electrically erasable cells which are volatile such as bi-stable flip-flops, dynamic random memory cells such as the switched capacitor (field effect transistor-capacitor combination), or a variety of other electrically erasable memory cells. Still further, the memory cells of the array of the AND plane do not have to be the same as the memory cells of the OR plane. For example, the memory cells of the AND plane can each comprise a single field effect transistor and the memory cells of the OR plane can each comprise two field effect transistors. Further, the physical layout of the memory cells of the AND and OR planes can be different.

What is claimed is:
1. Circuitry comprising:
a first array of rows and columns of devices;
each device comprises upper and lower memory cells with each memory cell being programmable and electrically erasable and having a control terminal and an input/output terminal and being adapted to store electrical charge;
a plurality of pairs of select lines, a first and a second select line of a separate pair of the select lines being coupled to the control terminals of all of the upper and lower memory cells, respectively, of a separate row of devices;
a first plurality of bit lines with a separate one of the bit lines being coupled to the input/output terminals of the memory cells of the devices of a separate one of the columns of devices; and
select line means coupled to the select lines for selectively causing one of the select lines of a pair of select lines to be selectively coupled to a first potential which facilitates the read out of information stored in memory cells and selectively causes the other select line of the pair of select lines to be coupled to a second potential level which acts to inhibit the read out of information from the memory cells, the select line means being adapted to selectively allow one select line of one or more pairs of select lines to be set to the first potential level during a common time period, and the select line means being further adapted to selectively allow both select lines of one or more pairs of select lines to be coupled to the second potential during a common time period.

2. The circuitry of claim 1 further comprising:
a second array of memory cells with each being programmable and electrically erasable and having a control terminal and an input/output terminal and being adapted to store electrical charge;
a plurality of word lines with a separate word line being coupled to the control terminal of each memory cell of a common row of memory cells of the second array;
a second plurality of bit lines with a separate bit line of the second plurality of bit lines being coupled to the input/output terminal of each memory cell of a common column of memory cells of the second array;
a separate one of the plurality of word lines being coupled to a separate one of the bit lines of the first array; and
the second plurality of bit lines of the second array being coupled to a sense amplifier which is adapted to sense signals.

3. The circuitry of claim 2 wherein each memory cell is nonvolatile.

4. Circuitry comprising:
a first array of devices comprising M rows and N columns of devices which M and N being positive integers;
M pairs of select lines, each pair of select lines comprising a select line upper (SLU) line and a select line lower (SLL) line and being associated with a separate one of the M rows of devices;
first N control lines with a separate one of the N control lines being associated with a separate one of the N columns of devices;
N bit lines with a separate one of the N bit lines being associated with a separate one of the N columns of devices;
each device comprises upper and lower memory cells with each memory cell being programmable and electrically erasable and comprising first and second field effect transistors each having a gate terminal and first and second input/output terminals;

the second input/output terminal of the first transistor of each memory cell being coupled to the first input/output terminal of the second transistor of the same memory cell;

each of the first transistors of the upper and lower memory cells being denoted as a Selection Transistor Upper Cell (STUC) and a Selection Transistor Lower Cell (STLC), respectively;

each of the second transistors of the upper and lower memory cells being denoted as a Memory Transistor Upper Cell (MTUC) and a Memory Transistor Lower Cell (MTLC), respectively;

the MTUC and MTLC of each device being adapted to store electrical charge which is indicative of information stored in a memory cell;

the SLU and SLL lines being coupled to the gate terminals of the STUC and STUC transistors, respectively, of a separate row of devices;

a separate one of the N control lines being coupled to the gate terminals of the MTUC and MTLC transistors of separate one of the columns of devices;

a separate one of the N bit lines being coupled to the first input/output terminals of the STUC and STLC transistors of the devices of a separate one of the columns of devices;

a second array of memory cells which are programmable and electrically erasable and comprise N rows and X columns with N and X being positive integers;

each of the memory cells of the second array comprises a first and a second field effect transistor that each have a gate terminal and an input/output terminal, the second field effect transistor being adapted to store electrical charge;

N word lines with a separate word line being associated with each row of memory cells;

second N control lines with a separate control line being associated with each row of memory cells;

X bit lines with a separate bit line being associated with each column of memory cells;

each of the N word lines being coupled to a separate one of the N first bit lines of the first array;

the X bit lines of the second array being coupled to a sense amplifier which is adapted to sense signals on the X bit lines;

a separate one of the N word lines being coupled to the gate terminals of first field effect transistors of the memory cells of a common row of memory cells of the second array;

a separate one of the N second control lines being coupled to the gate terminals of second transistors of the memory cells of a common row of memory cells of the second array; and a separate one of the X bit lines being coupled to a first input/output terminal of the first transistors of the second array of memory cells of a common row.

5. The circuitry of claim 4 wherein each of the MTUC and MTLC transistors has a gate region which is adapted to store electrical charge which is indicative of information stored in a memory cell.

6. The circuitry of claim 5 wherein the second input/output terminals of the MTUC transistors of a common row of devices are coupled together and the second output terminals of the MTLC transistors of a common row of devices are coupled together.

7. The circuitry of claim 5 wherein the second input/output terminals of the MTUC transistors of a common column of devices are coupled together and the second output terminals of the MTLC transistors of a common column of devices are coupled together.

8. The circuitry of claim 5 further comprising:

M input data terminals and M enable/disable input terminals;

select line data generator circuitry comprising M input data terminals and M enable/disable input terminals and M pairs of output data terminals with each pair comprising first and second output data terminals;

the first and second output data terminals of a separate pair of the M pairs of output data terminals being coupled to the SLU and SLL lines of a separate row of devices;

a separate data input terminal and a separate enable/disable input terminal being associated with a separate one of the M pairs of output data terminals;

the select line data generator circuitry being adapted to generate the same level of a data signal applied to one of the M data input terminals at the first output terminal of the pair of data output terminals associated therewith and to generate the opposite level of the data signal on the second output terminal of the pair of data output terminals associated therewith if an enable signal level is applied to the enable/disable terminal associated with the data input terminal, and;

the select line data generator further being adapted to generate the same signal level at both output terminals associated with a data input terminal and an enable/disable input terminal if a disable signal level is applied to the enable/disable input terminal independent of what level is applied to the data input terminal.

9. The circuitry of claim 8 further comprising:

column selection circuitry, bit line and control line driver circuitry, and sense amplifiers;

the column selection circuitry being coupled to the bit line and control line driver circuitry and being adapted to select any column of devices to allow data to be written into the memory cells of any device of the common column;

the bit line and control line driver circuits being coupled to the N control lines and to the N bit lines and being adapted to be able to drive the N bit lines and the N control lines to desired voltage levels within selected time periods;

the sense amplifiers being coupled to the N bit lines and being adapted to detect signals generated on same;

select line driver circuitry which couples the select line data generator circuitry to the select lines and is adapted to be able to drive the select lines to the desired voltage levels within selected time periods;

read, write and erase input terminals and a power supply terminal coupled to the select line driver circuitry and to the bit line and control line drivers; and the circuitry being adapted such that signals applied to the read/write/erase input terminals control the voltages generated by select line, bit line and control line driver circuitries.

10. The circuitry of claim 9 wherein each of the memory cells of the first and second arrays are nonvolatile type memory cells.

11. The circuitry of claim 10 wherein:

the first and second N control lines are coupled together with a separate one of the first N control lines being connected to a separate one of the second N control lines; and a separate one of the N bit lines of the first array is coupled to a separate one of the N word lines of the second array.

12. The circuitry of claim 11 further comprising:

N first pull-up elements with a separate one of each being coupled by one end thereof to a separate one of the N bit lines of the first array; and X second pull-up elements with a separate one of each being coupled by one end to a separate one of the X bit lines of the second array.

13. The circuitry of claim 12 wherein second ends of the N first pull-up elements are coupled together and are adapted to be couple to a third voltage source and second ends of the X second pull-up elements are coupled together and are adapted to be coupled to a fourth voltage source.

14. The circuitry of claim 10 further comprising second word line driver circuitry which couples the N bit lines of the first array to the N word lines of the second array.

15. The circuitry of claim 10 further comprising:

N first pull-up elements with a separate one of each being coupled by one end thereof to a separate one of the N bit lines of the first array; and X second pull-up elements with a separate one of each being coupled by one end to a separate one of the X bit lines of the second array.

16. The circuitry of claim 15 wherein second ends of the N first pull-up elements are coupled together and are adapted to be coupled to a first voltage source and second ends of the X second pull-up elements are coupled together and are adapted to be coupled to a second voltage source.

17. Circuitry comprising:

a first array of devices comprising M rows and N columns of devices with M and N being positive integers;

each device comprises upper and lower memory cells with each memory cell being programmable and electrically erasable and comprising a field effect transistor having a gate terminal and first and second input/output terminals and being adapted to store electrical charge;

M pairs of select lines, a first and second select line of a separate pair of select lines being coupled to the gate terminals of all of the transistors of the upper and lower memory cells, respectively, of a separate one of the rows of the first array;

a first plurality of N bit lines with a separate one of the bit lines being coupled to the first input/output terminal of all of the transistors of the memory cells of the devices of a separate column of devices of the first array;

a first plurality of N control lines with a separate one of the control lines being coupled to the second input/output terminal of the transistors of the memory cells of the devices of a separate column of devices of the first array; and select line means coupled to the select lines for selectively causing one of the select lines of a pair of select lines to be selectively coupled to a first potential which facilitates the read out of information stored in memory cells and causes the other select line of the pair of select lines to be coupled to a second potential level which acts to inhibit the read out of information from the memory cells, the select line means being adapted to selectively allow one select line of one or more pairs of select lines to be set to the first potential level during a common time period, and the select line means being further adapted to selectively allow both select lines of one or more pairs of select lines to be coupled to the second potential during a common time period.

18. The circuitry of claim 17 further comprising:

a second array of programmable and electrical erasable memory cells having N rows and X columns with N and X being positive integers;

each memory cell of the second array comprising a field effect transistor having a gate terminal and first and second input/output terminals and being adapted to store electrical charge;

N word lines with a separate one of the word lines being coupled to the gate terminal of each of the transistors of the memory cells of a separate row of memory cells of the second array;

X bit lines with a separate one of the X bit lines being coupled to the first input/output terminal of each of the transistors of the memory cells of a separate column of memory cells of the second array;

the X bit lines of the second array being coupled to a sense amplifier;

a second plurality of X control lines with a separate one of the X control lines being coupled to the second input/output terminals of each of the transistors of the memory cells of a separate column of the second array; and a separate one of the N bit lines of the first array being coupled to a separate one of the N word lines of the second array.

19. The circuitry of claim 18 wherein all of the memory cells are nonvolatile type memory cells.

20. The circuitry of claim 17 further comprising:

a second array of memory cells having N rows and X columns with N and X being positive integers;

each memory cell of the second array being programmable and electrically erasable and comprising a field effect transistor having a gate terminal and first and second input/output terminals and being adapted to store electrical charge;

N word lines with a separate one of the word lines being coupled to the gate terminal of each of the transistors of the memory cells of a separate row of memory cells of the second array;

X bit lines with a separate one of the X bit lines being coupled to the first input/output terminal of each of the transistors of the memory cells of a separate column of memory cells of the second array;

the X bit lines of the second array being coupled to a sense amplifier;

a plurality of X control lines with a separate one of the X control lines being coupled to the second input/output terminals of each of the transistors of the memory cells of a separate column of the second array; and a separate one of the N bit lines of the first array being coupled to a separate one of the N word lines of the second array.

21. The circuitry of claim 20 wherein all of the memory cells are nonvolatile type memory cells.

22. Circuitry comprising:

a first array of devices comprising M rows and N columns of devices with M and N being positive integers;

each device comprises upper and lower memory cells with each memory cell being programmable and electrically erasable and comprising a field effect transistor having a gate terminal and first and second input/output terminals and being adapted to store electrical charge;

M pairs of select lines, a first and second select line of a separate pair of select lines being coupled to the gate terminals of all of the transistors of the upper and lower memory cells, respectively, of a separate one of the rows of the first array;

a first plurality of N bit lines with a separate one of the bit lines being coupled to the first input/output terminal of all of the transistors of the memory cells of the devices of a separate column of devices of the first array; and select line means coupled to the select lines for selectively causing one of the select lines of a pair of select lines to be selectively coupled to a first potential which facilitates the read out of information stored in memory cells and causes the other select line of the pair of select lines to be coupled to a second potential level which acts to inhibit the read out of information from the memory cells, the select line means being adapted to selectively allow one select line of one or more pairs of select lines to be set to the first potential level during a common time period, and the select line means being further adapted to selectively allow both select lines of one or more pairs of select lines to be coupled to the second potential during a common time period.

23. An array of rows and columns of devices characterized in that:

each device comprises upper and lower memory cells which are programmable and electrically erasable and have a control terminal and an input/output terminal and are adapted to store electrical charge;

a plurality of pairs of select lines, a first and a second select line of a separate pair of the select lines being coupled to the control terminals of all of the upper and lower memory cells, respectively, of a separate row of devices;

a plurality of bit lines with a separate one of the bit lines being coupled to the output terminals of the memory cells of the devices of a separate one of the columns of devices; and select line means coupled to the select lines for selectively causing one of the select lines of a pair of select lines to be selectively coupled to a first potential which facilitates the read out of information stored in memory cells and selectively causes the other select line of the pair of select lines to be coupled to a second potential level which acts to inhibit the read out of information from the memory cells, the select line means being adapted to selectively allow one select line of one or more pairs of select lines to be set to the first potential level during a common time period, and the select line means being further adapted to selectively allow both select lines of one or more pairs of select lines to be coupled to the second potential during a common time period.

* * * * *